(12) United States Patent
Im et al.

(10) Patent No.: US 12,457,695 B2
(45) Date of Patent: Oct. 28, 2025

(54) DISPLAY APPARATUS

(71) Applicant: SAMSUNG ELECTRONICS CO., LTD., Suwon-si (KR)

(72) Inventors: Sangkyun Im, Suwon-si (KR); Jaehoo Park, Suwon-si (KR); Joowhan Lee, Suwon-si (KR); Jisoo Kim, Suwon-si (KR); Yonggu Do, Suwon-si (KR); Minhee Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 842 days.

(21) Appl. No.: 17/703,554

(22) Filed: Mar. 24, 2022

(65) Prior Publication Data

US 2022/0418116 A1   Dec. 29, 2022

Related U.S. Application Data

(63) Continuation of application No. PCT/KR2022/003628, filed on Mar. 15, 2022.

(30) Foreign Application Priority Data

Jun. 29, 2021   (KR) .................. 10-2021-0084902

(51) Int. Cl.
  *H05K 5/00*   (2025.01)
  *G09F 9/33*   (2006.01)
  (Continued)

(52) U.S. Cl.
  CPC .......... *H05K 5/0017* (2013.01); *G09F 9/335* (2021.05); *G09F 13/005* (2013.01); *G09F 13/30* (2013.01);
  (Continued)

(58) Field of Classification Search
  CPC ........ G09F 11/16; G09F 13/005; G09F 13/30; G09F 9/33; G09F 9/335; G09G 2320/068;
  (Continued)

(56) References Cited

U.S. PATENT DOCUMENTS 10,509,159 B2 * 12/2019 Lee ...................... G02B 6/0073
11,361,689 B2    6/2022 Onuki
(Continued)

FOREIGN PATENT DOCUMENTS

CA   2 350 687 A1   12/1999
FR    2912244 A1    8/2008
(Continued)

OTHER PUBLICATIONS

Communication issued Sep. 11, 2024 by the European Patent Office in European Patent application No. 22833355.5.
(Continued)

*Primary Examiner* — Ming Wu
(74) *Attorney, Agent, or Firm* — Sughrue Mion, PLLC

(57) ABSTRACT

A display apparatus is provided. The display apparatus includes: a housing including a base; a motor coupled to the housing; a plurality of rotating plates arranged at one side of the base in one direction and connected to the motor at a center of the base, the plurality of rotating plates configured to be rotated by the motor and the plurality of rotating plates including a first rotating plate and a second rotating plate; and a plurality of substrates, each of the plurality of substrates including an inorganic light emitting device such that the plurality of substrates are configured to display an image at the one side of the base in the one direction, the plurality of substrates including: a first substrate coupled to the first rotating plate, and a second substrate coupled to the second rotating plate.

15 Claims, 20 Drawing Sheets

(51) Int. Cl.
  *G09F 13/00* (2006.01)
  *G09F 13/30* (2006.01)
  *G09G 3/00* (2006.01)
  *G09G 3/32* (2016.01)
  *H01L 25/16* (2023.01)
  *H05K 5/02* (2006.01)

(52) U.S. Cl.
  CPC ............ *G09G 3/32* (2013.01); *H01L 25/162* (2013.01); *H01L 25/165* (2013.01); *H01L 25/167* (2013.01); *H05K 5/0217* (2013.01); *G09G 3/005* (2013.01); *G09G 2320/068* (2013.01)

(58) Field of Classification Search
  CPC ........... G09G 3/00; G09G 3/005; G09G 3/32; G09G 5/00; H01L 25/0753; H01L 25/162; H01L 25/165; H01L 25/167; H05K 5/0017; H05K 5/0217
  See application file for complete search history.

(56) References Cited

U.S. PATENT DOCUMENTS

| | | | |
|---|---|---|---|
| 11,495,154 | B2 | 11/2022 | Rohena et al. |
| 11,627,304 | B2 | 4/2023 | Kim |
| 2005/0035962 | A1 | 2/2005 | Ishibashi et al. |
| 2005/0231499 | A1 | 10/2005 | Wang et al. |
| 2007/0132953 | A1* | 6/2007 | Silverstein ........... H04N 13/337 348/E13.058 |
| 2010/0277696 | A1* | 11/2010 | Huebner ................ G03B 21/00 353/30 |
| 2012/0092623 | A1* | 4/2012 | Huebner .............. G03B 21/001 353/94 |
| 2019/0035317 | A1 | 1/2019 | Rohena et al. |
| 2019/0317343 | A1* | 10/2019 | Li ............................. G09G 3/36 |
| 2019/0332035 | A1* | 10/2019 | Mimura ............ G03G 15/0889 |
| 2019/0355295 | A1* | 11/2019 | Wang .................. H01L 25/0753 |
| 2019/0385987 | A1* | 12/2019 | Kong ................ H10H 20/8585 |
| 2020/0092538 | A1 | 3/2020 | Kaehler |
| 2021/0235069 | A1 | 7/2021 | Kim |

FOREIGN PATENT DOCUMENTS

| | | |
|---|---|---|
| JP | 6-342262 A | 12/1994 |
| JP | 2001-154614 A | 6/2001 |
| JP | 2003122275 A | 4/2003 |
| JP | 2004-229063 A | 8/2004 |
| JP | 2005-37636 A | 2/2005 |
| JP | 2005-309433 A | 11/2005 |
| KR | 10-2006-0030596 A | 4/2006 |
| KR | 10-0955512 B1 | 4/2010 |
| KR | 10-2015-0066321 A | 6/2015 |
| KR | 10-1887501 B1 | 8/2018 |
| KR | 10-2020-0015189 A | 2/2020 |
| KR | 10-2020-0037778 A | 4/2020 |
| KR | 10-2021-0003586 A | 1/2021 |
| KR | 10-2021-0051492 A | 5/2021 |
| WO | 2019/087857 A1 | 5/2019 |

OTHER PUBLICATIONS

International Search Report (PCT/ISA/210) dated Jul. 4, 2022 issued by the International Searching Authority in International Application No. PCT/KR2022/003628.

* cited by examiner

DISPLAY APPARATUS

CROSS-REFERENCE TO THE RELATED APPLICATIONS

This application is a by-pass Continuation Application of PCT Application No. PCT/KR2022/003628, filed on Mar. 15, 2022, which claims priority to Korean Patent Application No. 10-2021-0084902, filed on Jun. 29, 2021, in the Korean Intellectual Property Office, the disclosures of which are incorporated by reference herein in their entirety.

BACKGROUND

1. Field

The disclosure relates to a display apparatus, and more specifically, to a display apparatus that implements an image or a moving image through an afterimage effect.

2. Description of Related Art

A display apparatus is an output apparatus that converts acquired or stored electrical information into visual information and displays the visual information to a user, and is used in various fields, such as homes and businesses.

For example, examples of the display apparatus may include a monitor device connected to a personal computer (PC) or a server computer, a portable computer device, a navigation terminal device, a general television device, an Internet Protocol television (IPTV) device, a portable terminal device (e.g., a smart phone, a tablet PC, a personal digital assistant (PDA), or a cellular phone), various display devices used to reproduce images such as advertisements or movies in an industrial field, or other various types of audio/video systems.

The display apparatus (whether an emissive display or a non-emissive display) includes a light source device for converting an electrical signal into a visual signal, and the light source device includes a plurality of point light sources capable of emitting light independently. The light source may include a light emitting diode (LED) or an organic light emitting diode (OLED). For a replacement for the existing display panel, research has been conducted on a micro light emitting diode (referred to as a micro LED or μLED) panel that includes an inorganic light emitting device on a substrate and uses the inorganic light emitting device itself as a pixel. Micro light-emitting diode display panel (hereinafter, referred to as a micro LED panel) is one of flat display panels and includes a plurality of inorganic light-emitting diodes (inorganic LEDs) each having a size of 100 micrometers or less. Such an LED panel is not susceptible to burn-in and has excellent brightness, resolution, power consumption, and durability.

In the current display apparatuses, an image and/or a moving image implemented by a display is provided in a quadrangle or other fixed forms. Recently, there is a need to output various forms of images and/or moving images and display the images at various angles to increase the commercial use.

SUMMARY

Provided is a display apparatus capable of outputting various forms of displays.

Also provided is a display apparatus with reduced material cost by reducing the number of light emitting devices.

Additional aspects will be set forth in part in the description which follows and, in part, will be apparent from the description, or may be learned by practice of the presented embodiments.

According to an aspect of the disclosure, a display apparatus includes: a housing including a base; a motor coupled to the housing; a plurality of rotating plates arranged at one side of the base in one direction and connected to the motor at a center of the base, the plurality of rotating plates configured to be rotated by the motor and the plurality of rotating plates including a first rotating plate and a second rotating plate; and a plurality of substrates, each of the plurality of substrates including an inorganic light emitting device such that the plurality of substrates are configured to display an image at the one side of the base in the one direction, the plurality of substrates including: a first substrate coupled to the first rotating plate and having a bar shape that extends in a first radial direction from the center of the first rotating plate, and a second substrate coupled to the second rotating plate and having a bar shape that extends in a second radial direction from the center of the second rotating plate, wherein the first rotating plate and the second rotating plate are spaced apart from each other in the one direction.

The first substrate may include a first surface facing the first rotating plate, and a second surface disposed at a side opposite to the first surface and on which the inorganic light emitting device of the first substrate is mounted, and the second substrate may include a first surface facing the second rotating plate, and a second surface disposed at a side opposite to the first surface and on which the inorganic light emitting device of the second substrate is mounted.

A distance to the first rotating plate from the base in the one direction may be smaller than a distance to the second rotating plate from the base in the one direction, and the first rotating plate may be provided in a color darker than a color of the second rotating plate to increase a contrast ratio of the image.

The display apparatus may further include a polarizing cover configured to cover the plurality of rotating plates and the plurality of substrates at the one side of the base in the one direction.

The display apparatus may further include a rotating body connected to the motor and further connected to a central portion of the first rotating plate, and configured to transmit power generated from the motor to the plurality of rotating plates, the rotating body seated on the base at a central portion of the base.

The display apparatus may further include a connecting frame that extends along the one direction to connect the central portion of the first rotating plate to a central portion of the second rotating plate.

The rotating body may include an opening formed in a central portion of the rotating body, and the display apparatus further includes a communication device that includes: a communication board disposed in the opening of the rotating body; and a communication module mounted on the communication board and configured to receive image information.

The display apparatus may further include a fixing member disposed in the opening of the rotating body and fixes the communication device inside the opening of the rotating body, and coupled to the base and the communication board; and a cover plate arranged coplanar with the first rotating plate and covers an opening formed in the central portion of the first rotating plate such as to cover the fixing member and the communication device.

The first substrate may include a first coupling rib extending from one end of the first substrate toward the first rotating plate and coupled to the first rotating plate at an outer periphery of the first rotating plate, and the second substrate may include a second coupling rib extending from one end of the second substrate toward the second rotating plate and coupled to the second rotating plate at an outer periphery of the second rotating plate.

The display apparatus may further include a content receiving device configured to receive content data from a content source; and a controller configured to generate image data and a timing control signal corresponding to the received content data, wherein the controller may be configured to generate the timing control signal based on a frame rate corresponding to the received content data and a number of the plurality of substrates.

The display apparatus may further include an image transmission module provided on the base; and an image reception module provided on each of the plurality of rotating plates, wherein the image transmission module is configured to transmit and the image reception module is configured to receive the image data and the timing control signal in a wireless manner.

The controller may be further configured to determine a number of rotations of the motor based on the frame rate corresponding to the content data.

The display apparatus may further include a power transmission interface provided on the base; and a power reception interface provided on each of the plurality of rotating plates, wherein the power transmission interface is in contact with the power reception interface provided on at least one of the plurality of rotating plates and is configured to transmit power to the power reception interface provided on the at least one of the plurality of rotating plates.

The image reception module provided on the first rotating plate may be configured to receive first image data corresponding to a first object, and the image reception module provided on the second rotating plate may be configured to receive second image data corresponding to a second object.

The first object may represent a background, and the second object represents an object other than the background.

According to an aspect of the disclosure, a display apparatus includes: a plurality of pulleys; a belt provided on two pulleys from among the plurality of pulleys, the two pulleys distanced from each other in a first direction; a motor configured to rotate the belt along the two pulleys by rotating at least one pulley from among the plurality of pulleys; and a plurality of substrates that extend in a second direction that is perpendicular to the first direction, each of the plurality of substrates including a plurality of inorganic light emitting devices that are arranged in the second direction, and the plurality of substrates are connected to the belt and configured to rotate with the belt, based on driving of the motor, wherein the plurality of inorganic light emitting devices of the plurality of substrates are configured to form an image based on the plurality of substrates being rotated by the driving of the motor.

The display apparatus may further include a plurality of transparent wires, wherein the plurality of transparent wires include the plurality of substrates, respectively, and the plurality of transparent wires are connected to the belt and configured to rotate with the belt, based on the driving of the motor.

The display apparatus may further include a main body in which the plurality of pulleys, the belt, the motor, and the plurality of substrates are arranged.

The main body may include at least one frame.

According to an aspect of the disclosure a display apparatus includes: a motor; a rotating plate arranged at one side of the motor in one direction, wherein a center of the rotating plate is connected to the motor, and the rotating plate is configured to be rotated by the motor around an axis extending in the one direction through the center of the rotating plate; and at least one transparent wire that is connected to the rotating plate at a distance from the center of the rotating plate in a direction that is perpendicular to the one direction, and extends from the rotating plate in the one direction, wherein the at least one transparent wire is configured to rotate with the rotating plate, based on driving of the motor, and each of the at least one transparent wire includes a plurality of inorganic light emitting devices arranged in the one direction such that the at least one transparent wire is configured to display an image in the direction that is perpendicular to the one direction, while rotating based on the driving of the motor.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
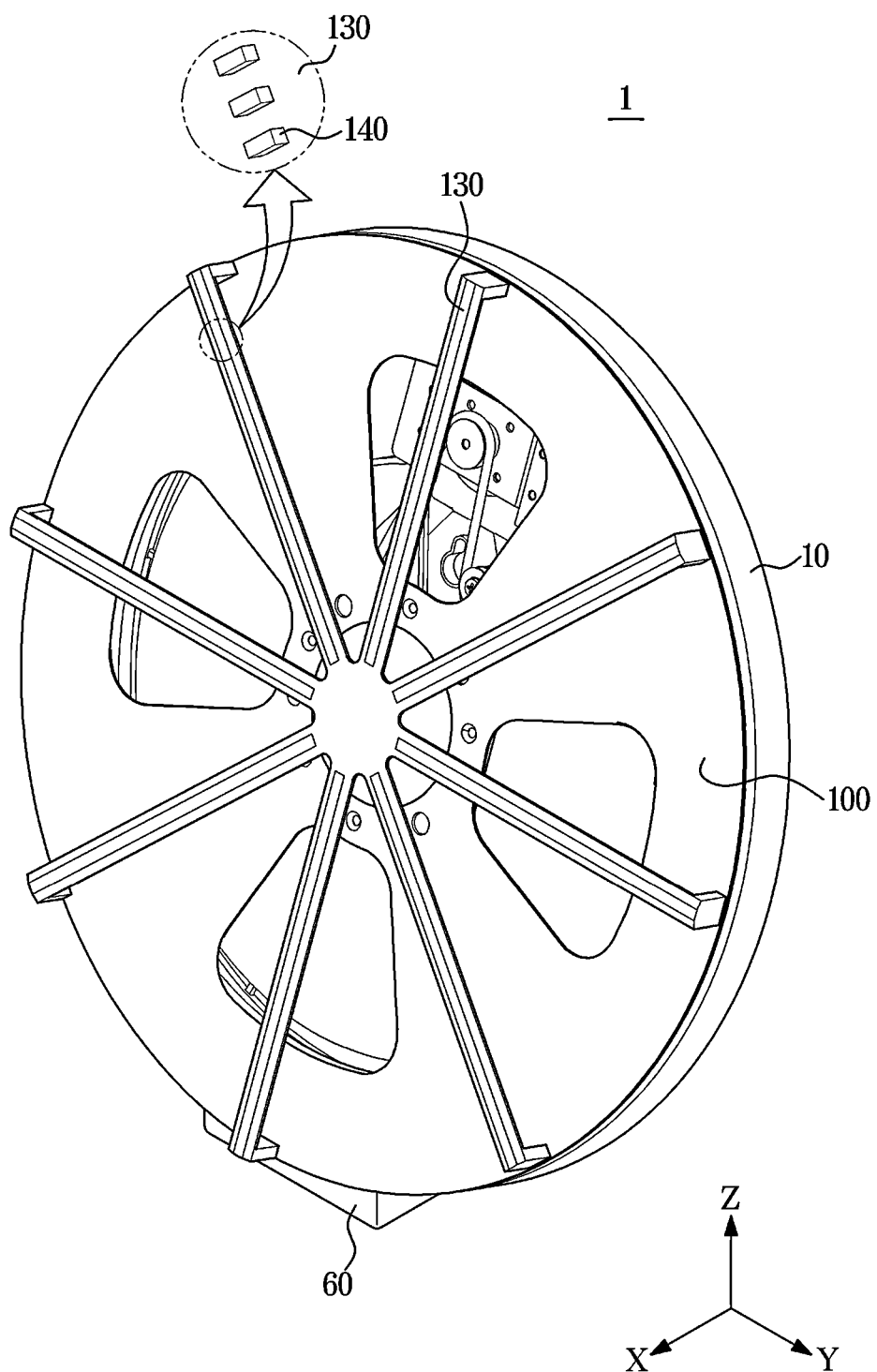
FIG. 1 is a perspective view illustrating a display apparatus according to an embodiment of the disclosure.

The embodiments described herein and illustrated in the drawings are non-limiting example embodiments, so it should be understood that they may be replaced with various equivalents and modifications according to the disclosure.

Throughout the drawings, like reference numerals refer to like parts or components.

The terminology used herein is for the purpose of describing particular embodiments only and is not intended to limit the disclosure. It is to be understood that the singular forms "a," "an," and "the" include plural references unless the context clearly dictates otherwise. It will be further understood that the terms "include", "comprise" and/or "have" when used in this specification, specify the presence of stated features, integers, steps, operations, elements, and/or components, but do not preclude the presence or addition of one or more other features, integers, steps, operations, elements, components, and/or groups thereof.

The terms including ordinal numbers like "first" and "second" may be used to explain various components, but the components are not limited by the terms. The terms are only for the purpose of distinguishing a component from another. Thus, a first element, component, region, layer or section discussed below could be termed a second element, component, region, layer or section without departing from the teachings according to the disclosure. Descriptions shall be understood as to include any and all combinations of one or more of the associated listed items when the items are described by using the conjunctive term "~ and/or ~," or the like.

The terms "front", "rear", "left", "right", etc. as herein used are defined with respect to the drawings, but the terms may not restrict the shape and position of the respective components.

Hereinafter, non-limiting example embodiments according to the disclosure will be described in detail with reference to the accompanying drawings.

Figure 2:
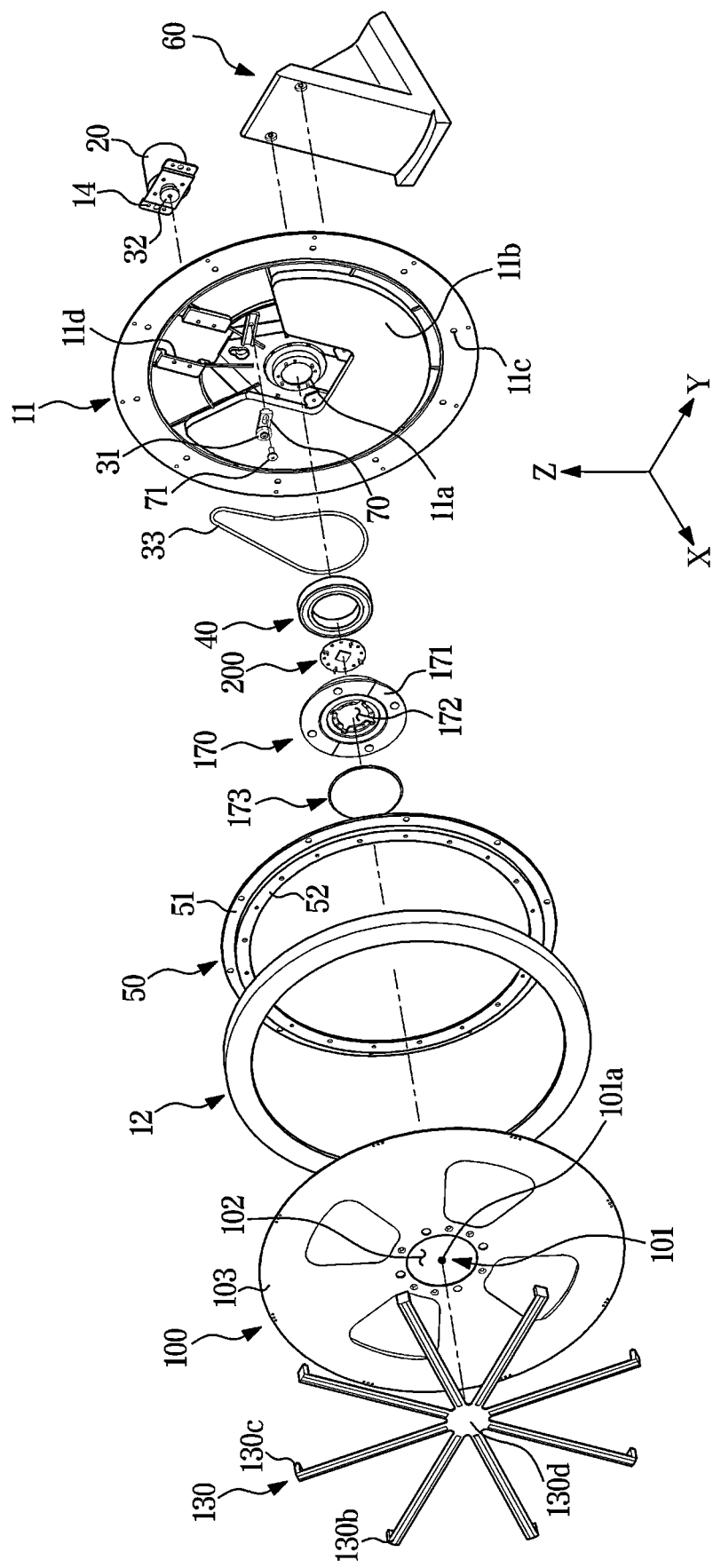
FIG. 2 is an exploded perspective view illustrating the display apparatus shown in FIG. 1.
Figure 3:
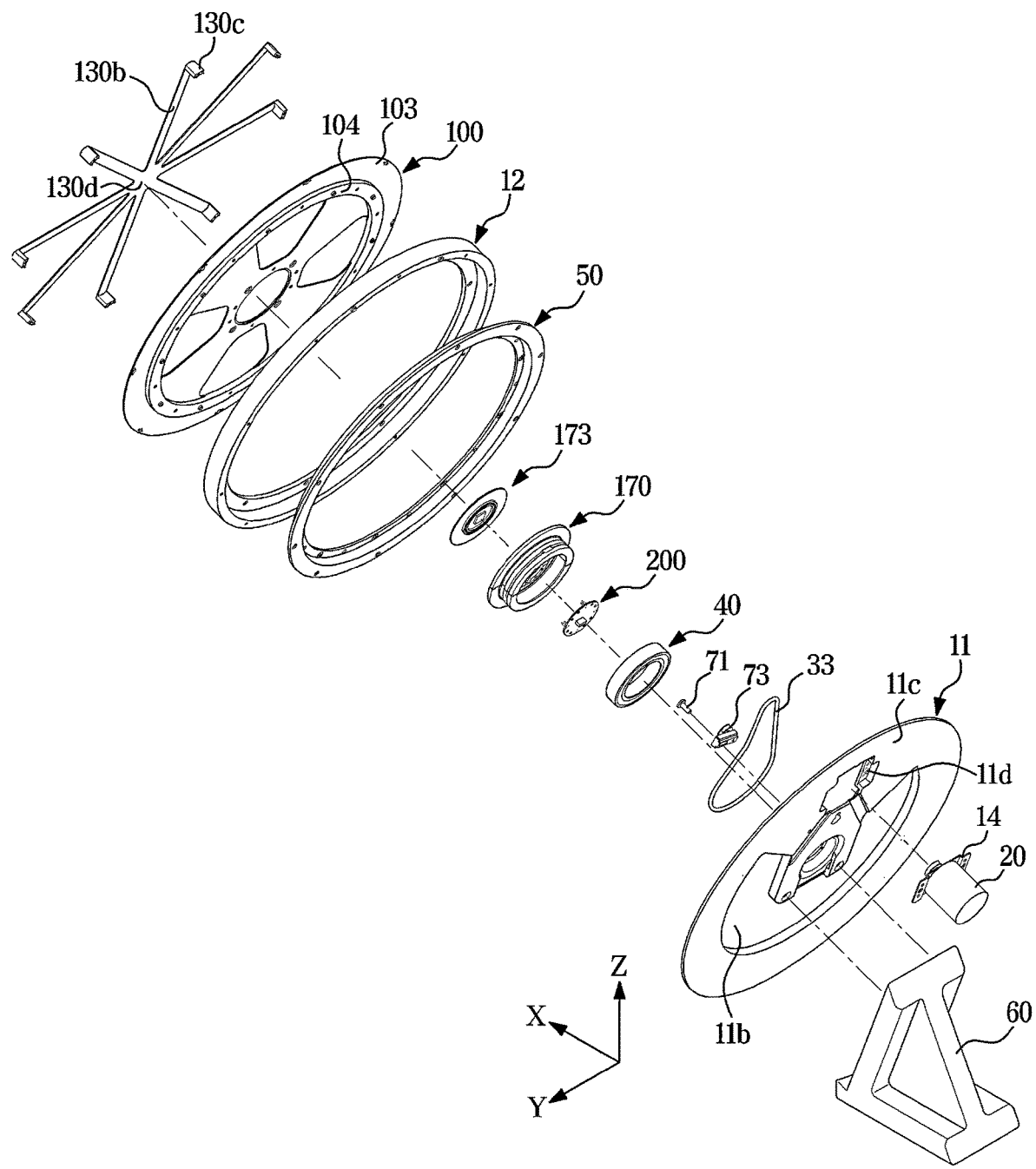
FIG. 3 is an exploded perspective view illustrating the display apparatus shown in FIG. 2 at a different angle.
Figure 4:
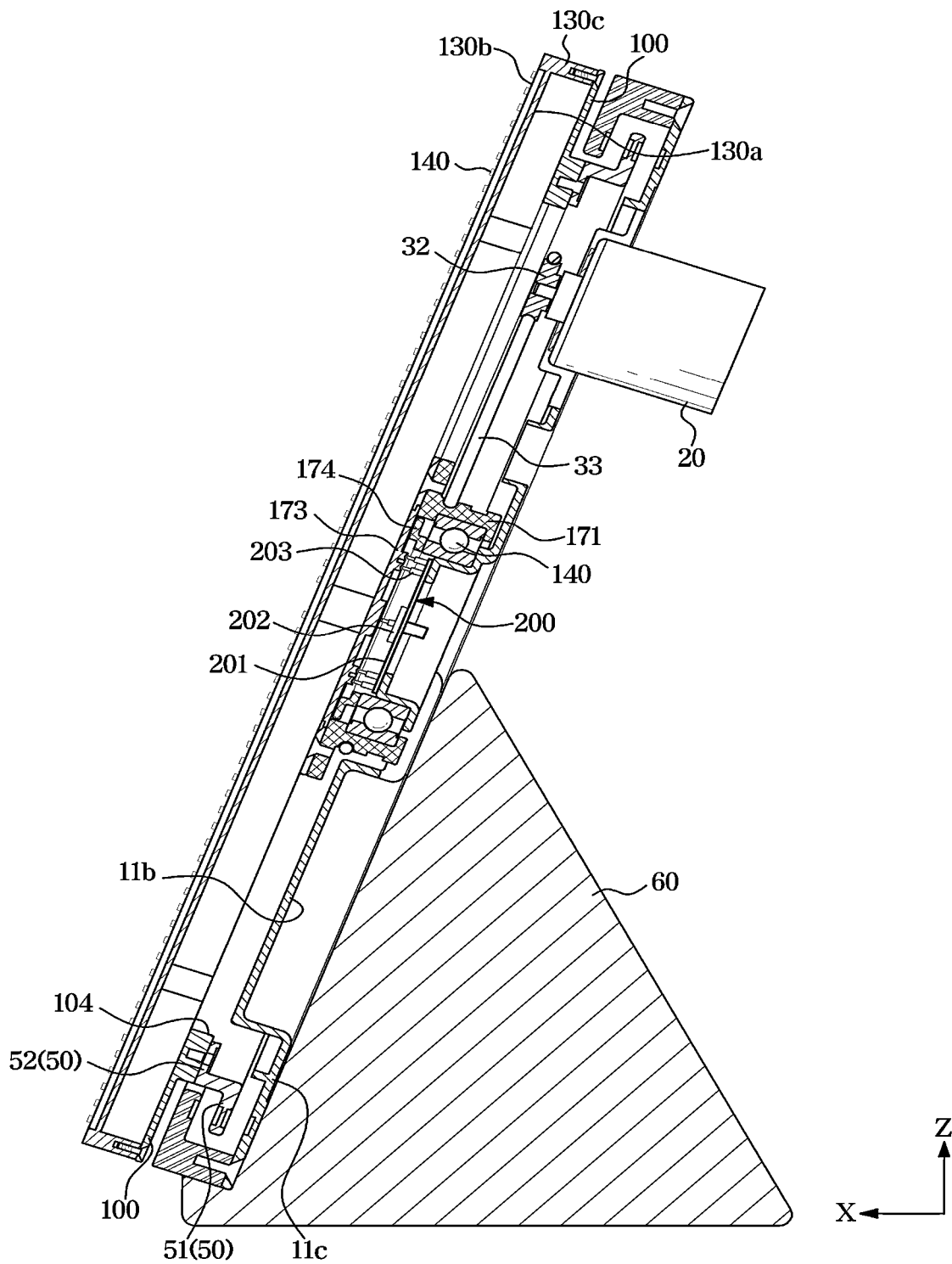
FIG. 4 is a cross-sectional view of the display apparatus shown in FIG. 1.

FIG. 1 is a perspective view illustrating a display apparatus according to an embodiment of the disclosure. FIG. 2 is an exploded perspective view illustrating the display apparatus shown in FIG. 1. FIG. 3 is an exploded perspective view illustrating the display apparatus shown in FIG. 2 at a different angle. FIG. 4 is a cross-sectional view of the display apparatus shown in FIG. 1.

A display apparatus 1 according to an embodiment of the disclosure may process an image signal received from the outside and visually display the processed image. The display apparatus 1 may not only be used for personal use at home, but may also be used for commercial use in a business place. The display apparatus 1 may visually display commercial advertisements. The display apparatus 1 may be installed in various places. For example, the display apparatus 1 may be installed in a place that a large number of people may access, such as a building rooftop, a bus stop, a subway station, a shopping mall, a movie theater, a company, or a store.

The display apparatus 1 may receive content data including an image signal, a video signal and/or an audio signal from various content sources. In addition, the display apparatus 1 may output image, video, and/or audio corresponding to the image signal, the video signal and/or the audio signal. For example, the display apparatus 1 may receive content data through a broadcast reception antenna or a wired cable, receive content data from a content reproduction device, or receive content data from a content providing server of a content provider.

Referring to FIGS. 1 to 4, the display apparatus 1 according to the embodiment of the disclosure may include a housing 10 and a display panel. The display panel may include a rotating plate 100 and components provided on the rotating plate 100. For example, the display panel may include the rotating plate 100, a substrate 130, and inorganic light emitting devices 140.

The housing 10 may cover the circumference of the rotating plate 100. The housing 10 may support the rotating plate 100 and the substrate 130 such that an image is stably implemented. The housing 10 may include a base 11 and a circumferential housing 12.

The base 11 may be disposed at a side (e.g., a rear side) of the rotating plate 100 and the substrate 130 in the −X direction to support the rotating plate 100 and the substrate 130. The base 11 may be formed in a substantially disk shape. The base 11 may be coupled to the rotating plate 100 in various methods. The base 11 may be screw-coupled to a stand 60 and the circumferential housing 12. However, the coupling method is not limited to the above example. The base 11 may be provided at a front side thereof with the rotating plate 100 and a support plate 50 and coupled at a rear side thereof to the stand 60, to support the display apparatus. The stand 60 may be disposed below the lowermost of the components of the display apparatus 1.

The base 11 may include a seating portion 11a, a step portion 11b, a peripheral portion 11c, and a motor coupling portion 11d.

The seating portion 11a may be provided in the central portion of the base 11. The seating portion 11a may seat a rotating body 170 thereon. The seating portion 11a may be formed to have a step difference from the step portion 11b. The seating portion 11a may allow the rotating body 170 to be stably seated on the base 11. The step portion 11b may protrude toward the rotating plate 100. The step portion 11b may form a protrusion portion. The protrusion portion may reduce an undesired separation distance between the base 11 and the rotating plate 100 to make the display apparatus 1 slim. The peripheral portion 11c may form a periphery of the base 11. For example, the peripheral portion 11c may be formed at a circumference of the step portion 11b. The base 11 may be coupled to other components of the display apparatus 1, such as the circumferential housing 12, at the peripheral portion 11c. The motor coupling portion 11d may be formed to correspond to a coupling bracket 14 so that the motor 20 is coupled to the base 11. A motor 20 may be coupled to the coupling bracket 14 to rotate the rotating plate 100. The motor coupling portion 11d and the coupling bracket 14 may be coupled to each other.

The circumferential housing 12 may cover the circumference of the display apparatus. The circumferential housing 12 may be coupled to the base 11 to accommodate components, such as the rotating body 170, a bearing 40, and the support plate 50 in the housing 10. The circumferential housing 12 may be formed in a substantially annular shape.

The rotating plate 100 may be disposed at one side of the base 11 in one direction and rotate. The rotating plate 100 may be rotated by receiving power from the motor 20. The substrate 130 coupled to the rotating plate 100 may also be rotated by the rotation of the rotating plate 100. Because the inorganic light emitting devices 140 are mounted on the substrate 130, the rotation of the substrate 130 may leave an afterimage, which may be used for a display.

The rotating plate 100 may be coupled to the support plate 50 and the rotating body 170. The rotating plate 100 may be coupled to the rotating body 170. Because the rotating body 170 is connected to the motor 20 through a pulley and a belt 33, the rotating body 170 may transmit a driving force to the rotating plate 100. The driving force transmitted to the rotating plate 100 may rotate the rotating plate 100 and the substrate 130. The rotating plate 100 may be coupled to the rotating body 170 at the central portion 101 thereof.

The rotating plate 100 may include the central portion 101, an opening 102, a peripheral portion 103, and a coupling portion 104. The coupling portion 104 may be coupled to a support portion 52 of the support plate 50. The peripheral portion 103 may form a circumference of the rotating plate 100. The peripheral portion 103 may be formed at a circumference of the coupling portion 104.

The substrate 130 may be coupled to the rotating plate 100 at one side of the rotating plate 100 in one direction and rotated. The substrate 130 may extend from a central portion 130*d* along a radial direction of the rotating plate 100. For example, the substrate 130 may include a bar shape. The substrate 130 extending in a radial direction from the central portion 130*d* may be provided in plural. The inorganic light emitting devices 140 may be mounted on the substrate 130. Because the inorganic light emitting devices 140 may emit light by itself without requiring a separate backlight unit (BLU), the display apparatus may be provided in a slim thickness. The inorganic light emitting devices 140 may receive image information from a communication module 202 (refer to FIG. 4) to implement an image and/or a moving image (a display). In this case, because the substrate 130 rotates rapidly, a display resulting from an afterimage may be implemented.

In other words, light emitted from the inorganic light emitting device 140 may leave a visual afterimage to the user. An image may be generated by light emitted from different positions according to rotation of the substrate 130. A user may view an image that is a combination of afterimages of lights consecutively emitted at different positions.

The substrate 130 may include a first surface 130*a*, a second surface 130*b*, and a coupling rib 130*c*. The first surface 130*a* may be a surface 130*a* facing the rotating plate 100. The first surface 130*a* may face the rotating plate 100. The second surface 130*b* may be disposed on the opposite side of the first surface 130*a* and have the inorganic light emitting devices 140 mounted thereon. The substrate 130 may extend radially from the central portion 130*d*. The coupling rib 130*c* may extend from one end of the substrate 130 in a radial direction toward the rotating plate 100. The coupling rib 130*c* may be coupled to the rotating plate 100 at the peripheral portion 103 of the rotating plate 100. For example, the coupling rib 130*c* may be screw-coupled to the rotating plate 100. With such a configuration, the rotating plate 100 and the substrate 130 may rotate as one body.

The display apparatus 1 according to the embodiment of the disclosure may further include the rotating body 170, a cover plate 173, a fixing member 174, the bearing 40, the motor 20, and pulleys (e.g., a first pulley 31, and a second pulley 32). The fixing member 174 and the cover plate 173 may form components included in the rotating body 170.

The rotating body 170 may be coupled to the rotating plate 100 to rotate the rotating plate 100. The rotating body 170 may be coupled to the rotating plate 100 at the central portion 101 of the rotating plate 100. The rotating body 170 may be connected to the motor 20 through the first pulley 31, the second pulley 32, and the belt 33. The rotating body 170 may receive power from the motor 20, and may transmit the received power to the rotating plate 100. The rotating body 170 may include a body portion 171 and an opening 172 formed in the central portion of the body portion 171. A communication device 200 may be disposed in the opening 172 of the rotating body 170.

The cover plate 173 may cover the opening 102 provided in the central portion 101 of the rotating plate 100. In addition, the cover plate 173 may also cover the opening 172 of the rotating body 170. Accordingly, the communication device 200 disposed in the opening 172 of the rotating body 170 may be covered.

The fixing member 174 may be disposed between the cover plate 173 and the base 11 to fix the communication device 200 to be described below. The fixing member 174 may be coupled to the base 11. The fixing member 174 may allow a communication board 201 to be disposed between the base 11 and the fixing member 174 such that the communication board 201 is fixed in the opening 172 of the rotating body 170.

The bearing 40 may support rotation of the rotating body 170. For example, the bearing 40 may be a ball bearing. The bearing 40 may be seated on the seating portion 11*a* of the base 11. The bearing 40 may be positioned between the base 11 and the rotating body 170.

The motor 20, the first pulley 31, and the second pulley 32 may transmit power to the rotating body 170, the rotating plate 100, and the substrate 130. The first pulley 31 may be coupled to the base 11 by a coupling portion 70 and a fastening member 71, and the second pulley 32 may be coupled to the base 11 by the coupling bracket 14.

The display apparatus 1 according to the embodiment of the disclosure may further include the support plate 50. The support plate 50 may include a support portion 52 and a peripheral portion 51. The support portion 52 may be coupled to the coupling portion 104 of the rotating plate 100 to support the rotating plate 100. The peripheral portion 51 may be formed on an outer periphery of the support portion 52.

The display apparatus 1 according to the embodiment of the disclosure may further include the communication device 200. The communication device 200 may be located in the opening of the rotating body 170. The communication device 200 may include a communication board 201, a communication module 202, and a connection pin 203. The communication board 201 may be disposed adjacent to the central portion of the base 11. The communication board 201 may be disposed between the base 11 and the fixing member 174. The base 11 may be coupled to the communication board 201 and the fixing member 174 by passing through the communication board 201 and the fixing member 174. The communication module 202 may be mounted on the communication board 201. The connection pin 203 may allow the substrate 130 and the communication module 202 to be electrically connected to each other. The connection pin 203 may be coupled to the communication board 201 by penetrating the communication board 201 at the peripheral portion of the communication board 201. The connection pin 203 may be provided in plural.

Figure 5:
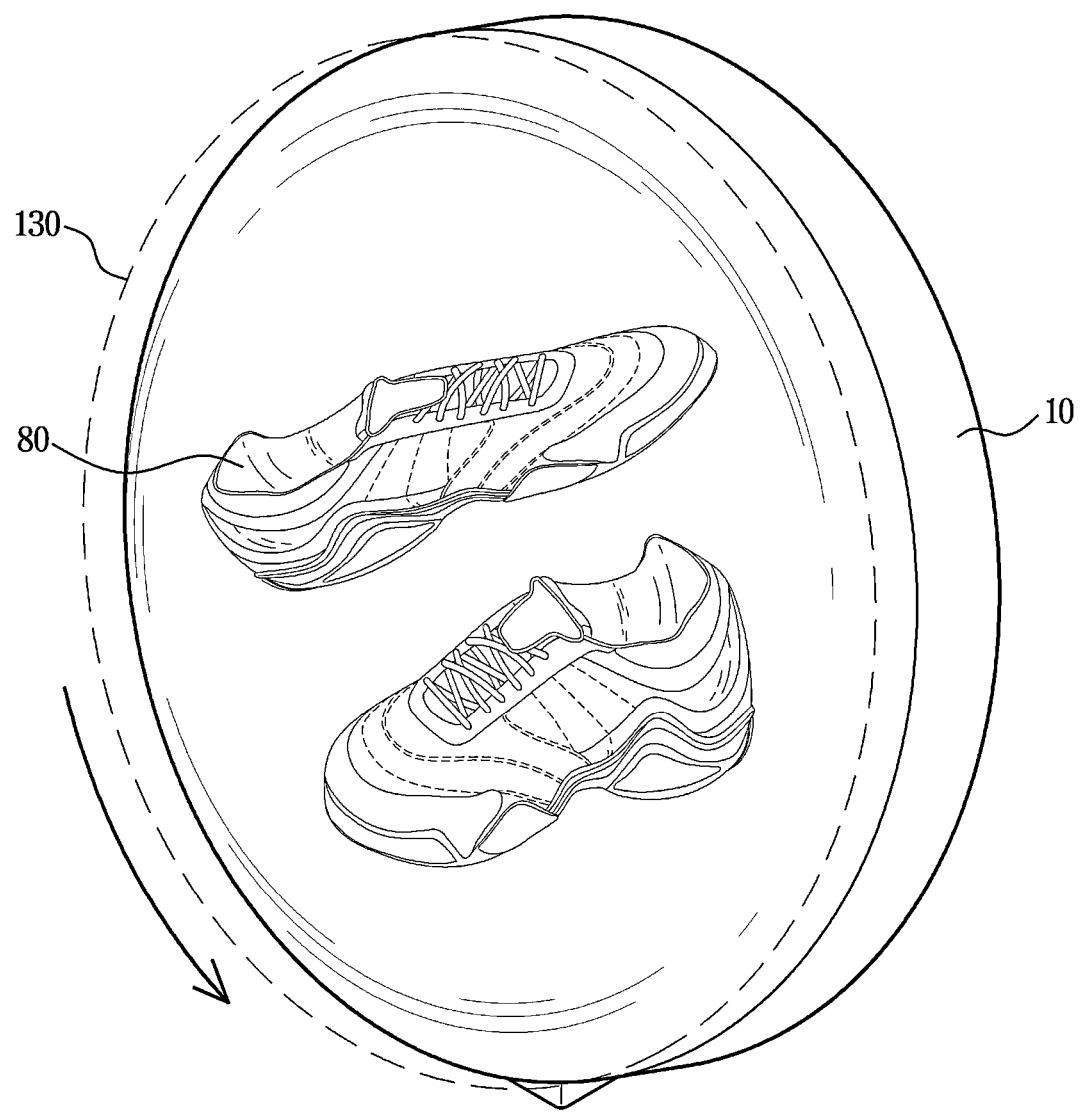
FIG. 5 is a view illustrating a state in which an image and/or a moving image is implemented in the display apparatus shown in FIG. 1.

FIG. 5 is a view illustrating a state in which an image and/or a moving image is implemented in the display apparatus shown in FIG. 1.

Referring to FIG. 5, the display apparatus 1 according to the embodiment of the disclosure allows the rotating plate 100 and the substrate 130, on which the inorganic light emitting devices 140 are mounted, to be rotated so that an afterimage resulting from the rotation is implemented as a display. For example, an image 80 (e.g., a still image and/or a moving image) may be displayed on a rotation trajectory of the inorganic light emitting devices 140 mounted on the substrate 130. The image 80 according to the embodiment of the disclosure may form a two dimensional (2D) image.

According to the embodiment of the disclosure, because the display (an image 80) is implemented by rotating the rotating plate 100 and the substrate 130 of the display apparatus, the display may be implemented in various shapes, such as a circle, besides the existing quadrangular shape. In addition, because the display is implemented by rotation, the inorganic light emitting devices 140 do not need to be mounted over the entire display area, so that the number of the inorganic light emitting devices 140 may be reduced. Accordingly, the material cost and production cost of the display apparatus 1 may be reduced.

Figure 6:
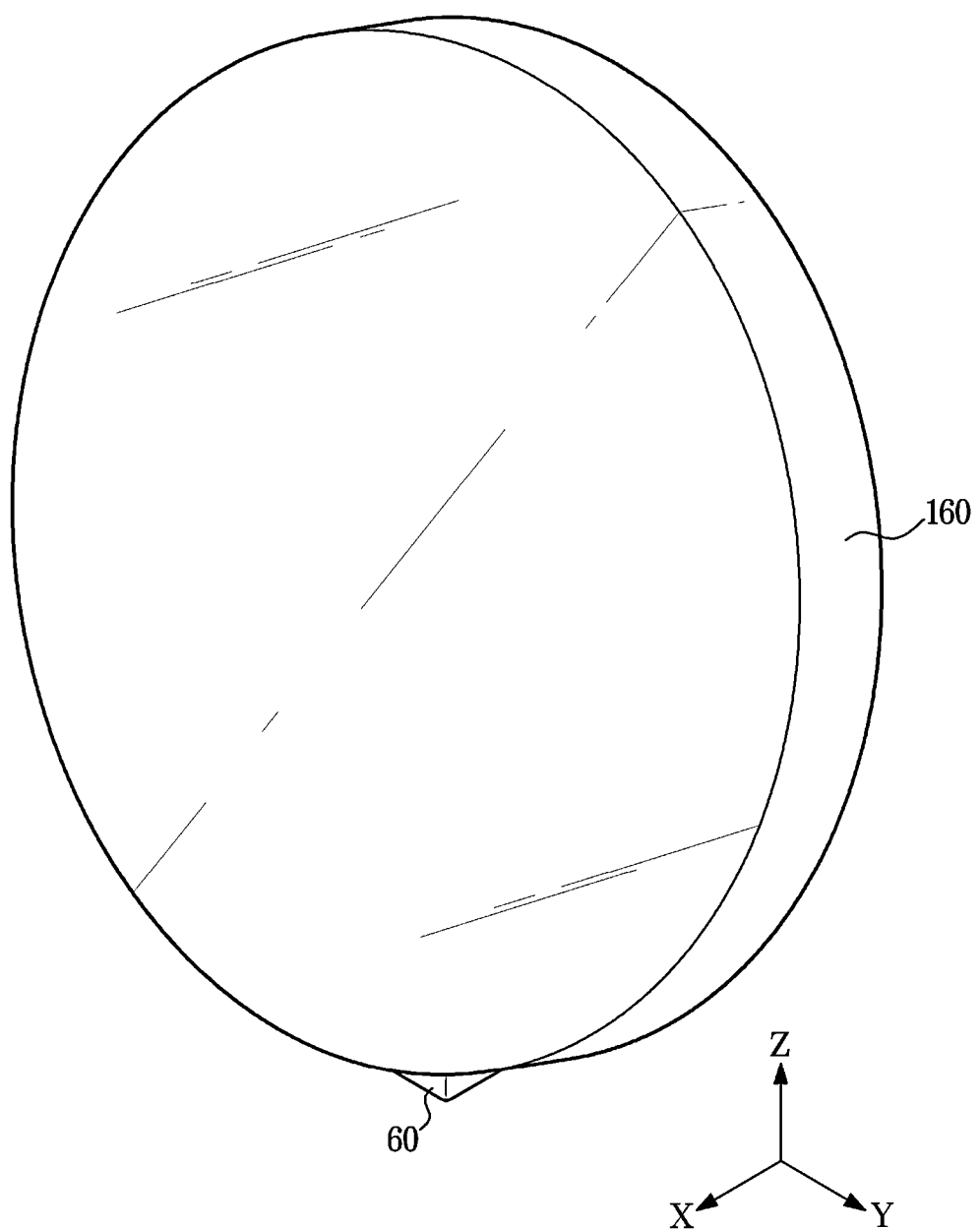
FIG. 6 is a perspective view illustrating a display apparatus according to another embodiment of the disclosure.
Figure 7:
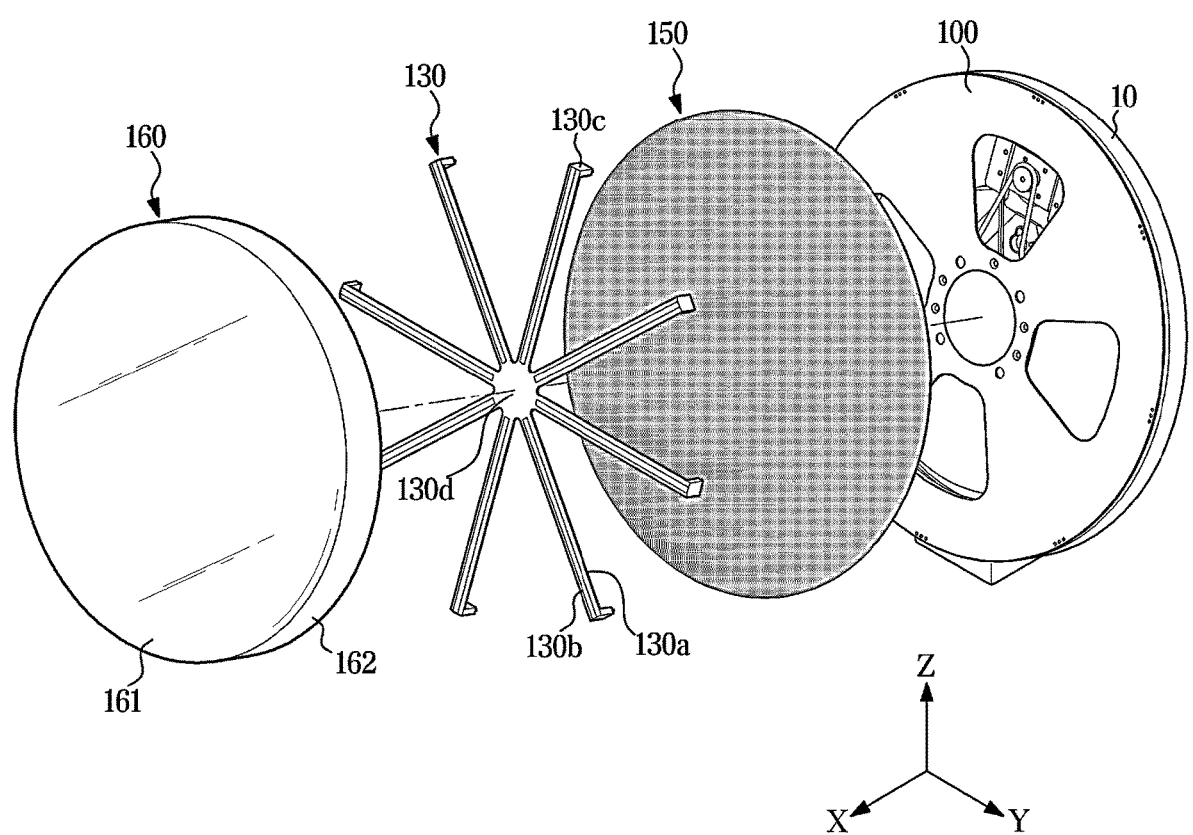
FIG. 7 is an exploded perspective view illustrating the display apparatus shown in FIG. 6.

FIG. 6 is a perspective view illustrating a display apparatus according to another embodiment of the disclosure. FIG. 7 is an exploded perspective view illustrating the display apparatus shown in FIG. 6.

The same reference numerals are assigned to the same configurations as those in the above-described embodiment, and detailed description thereof may be omitted.

Referring to FIGS. 6 and 7, a display apparatus 2 according to another embodiment of the disclosure may include a rotating plate 100, a substrate 130, a dark plate 150, and a polarizing cover 160.

The dark plate 150 may be coupled to one side of the rotating plate 100. The dark plate 150 may increase the contrast ratio when realizing a display according to rotation of inorganic light emitting devices 140. The dark plate 150 may be disposed between the substrate 130 and the rotating plate 100. The substrate 130 may be coupled to the dark plate 150. For example, the dark plate 150 may have a black color. However, the dark plate 150 may not be black, and may be provided in a color darker than that of a first rotating plate 110 and a second rotating plate 120 (refer to FIG. 9) to increase the contrast ratio of the image. In addition, the dark plate 150 has been described as increasing the contrast ratio of the image in the embodiment, but embodiments of the disclosure are not limited thereto. For example, a second surface 130b of the substrate 130 may be provided in black or a color darker than other components, or the rotating plate 100 may be provided in a color darker than other components to increase the contrast ratio of the display.

The polarizing cover 160 may be disposed at one side of the rotating plate 100, the dark plate 150, and the substrate 130 in one direction. The polarizing cover 160 may cover the rotating plate 100, the dark plate 150, and/or the substrate 130. The polarizing cover 160 may be disposed on a side in which an image is implemented with respect to the substrate 130. The polarizing cover 160 may allow the rotating plate 100 and the substrate 130 covered by the polarizing cover 160 to be invisible from the outside of the display apparatus 2 while blocking light emitted from the inorganic light emitting devices 140 from being reflected, thereby implementing a clear image.

The polarizing cover 160 may include a first cover portion 161 and a second cover portion 162. The first cover portion 161 may cover the one side of the substrate 130 and the rotating plate 100 in the one direction. The first cover portion 161 may be formed in a substantially circular plate shape. The second cover portion 162 may extend from the circumference of the first cover portion 161 toward the base 11, the substrate 130, and the rotating plate 100. The second cover portion 162 may cover the circumferences of the substrate 130 and the rotating plate 100.

Figure 8:
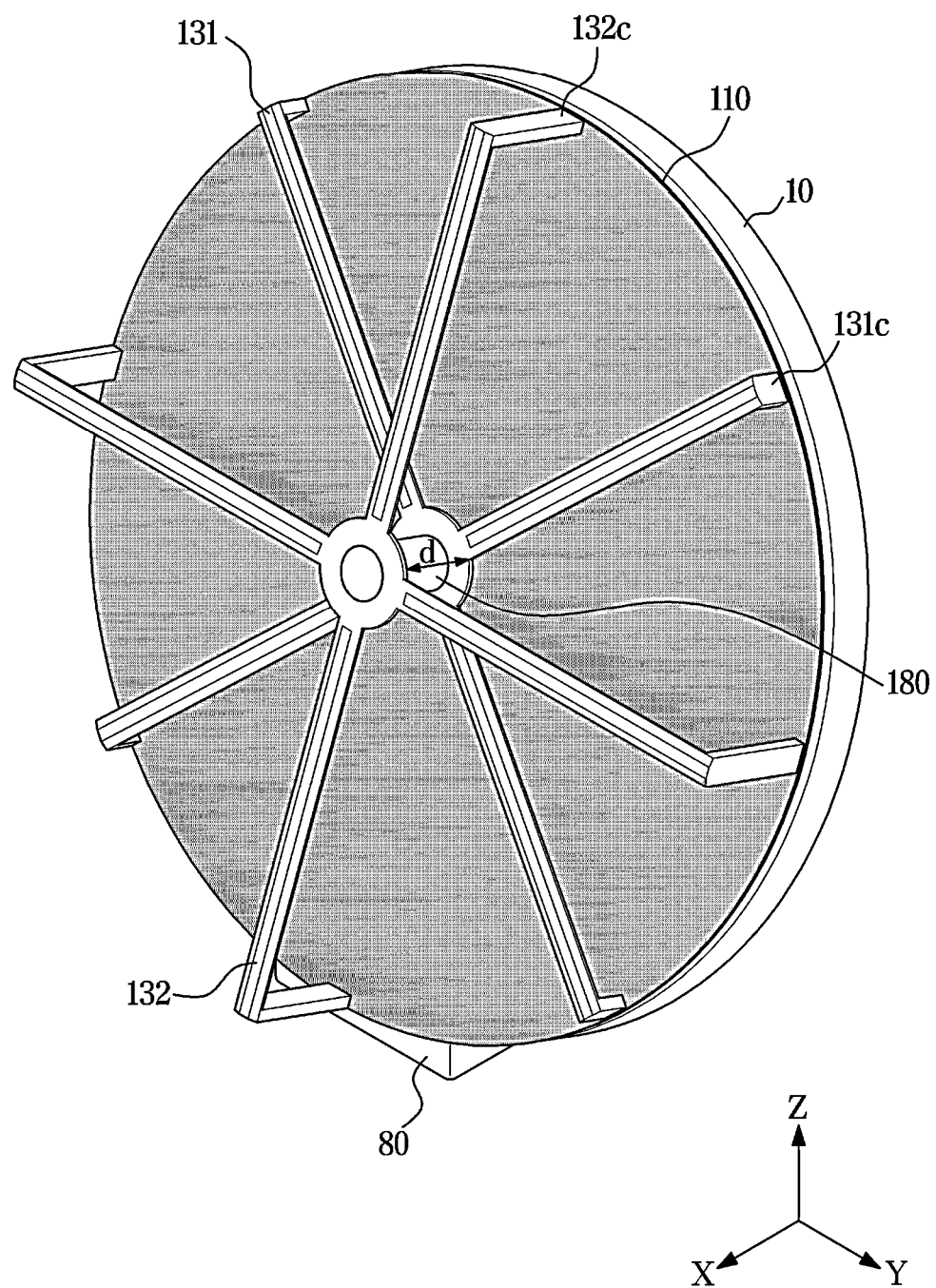
FIG. 8 is a perspective view illustrating a display apparatus according to another embodiment of the disclosure.

FIG. 8 is a perspective view illustrating a display apparatus according to another embodiment of the disclosure.

The same reference numerals are assigned to the same configurations as those in the above-described embodiments, and detailed description thereof may be omitted. For example, although the polarizing cover 160 is omitted in FIG. 8, the polarizing cover 160 may be employed as in the embodiment shown in FIGS. 6 and 7.

Referring to FIG. 8, a display apparatus 3 according to another embodiment of the disclosure may include a rotating plate 100, a plurality of a substrate 130, and a connecting frame 180. The rotating plate 100 may be provided in a color darker than those of other components to increase the contrast ratio of the display. In the embodiment, a dark plate 150 is not separately provided, and the rotating plate 100 is provided in a darker color compared to other components. However, embodiments of the disclosure are not limited thereto, and a dark plate 150 may be provided separately.

The plurality of the substrate 130 may include a first substrate 131 and a second substrate 132. Inorganic light emitting devices 140 may be mounted on each of the first substrate 131 and the second substrate 132 to implement an image. The first substrate 131 may be positioned adjacent to the rotating plate 100. The second substrate 132 may be spaced apart from the rotating plate 100 in one direction by a predetermined distance d that is greater than a distance by which the first substrate 131 is spaced part from the rotating plate 100 in the one direction. The second substrate 132 may be spaced apart from the first substrate 131 by a predetermined distance d in the one direction. The first substrate 131 may include a first coupling rib 131c (refer to FIG. 10) coupled to the rotating plate 100, and the second substrate 132 may include a second coupling rib 132c (refer to FIG. 10) coupled to the rotating plate 100. The first coupling rib 131c may extend from one end of the first substrate 131 in the radial direction toward the rotating plate 100. The second coupling rib 132c may extend from one end of the second substrate 132 in the radial direction toward the rotating plate 100. For example, the second coupling rib 132c may extend at a length greater than a length at which the first coupling rib 131c extends.

The first substrate 131 and the second substrate 132 may be connected to each other through the connecting frame 180 at the central portion thereof. The first substrate 131 and the second substrate 132 may include a connection hole 131d and a connection hole 132d, respectively, formed in the central portions thereof. The connecting frame 180 connects the first substrate 131 and the second substrate 132 such that the first substrate 131 and the second substrate 132 are rotated by a single motor 20. The connecting frame 180 may extend in the one direction. One end of the connecting frame 180 may be coupled to the first substrate 131, and the other end of the connecting frame 180 may be coupled to the second substrate 132. For example, the predetermined distance d between the first substrate 131 and the second substrate 132 may be the same as the length of the connecting frame 180. The length of the connecting frame 180 between the first substrate 131 and the second substrate 132 may be variable.

Figure 9:
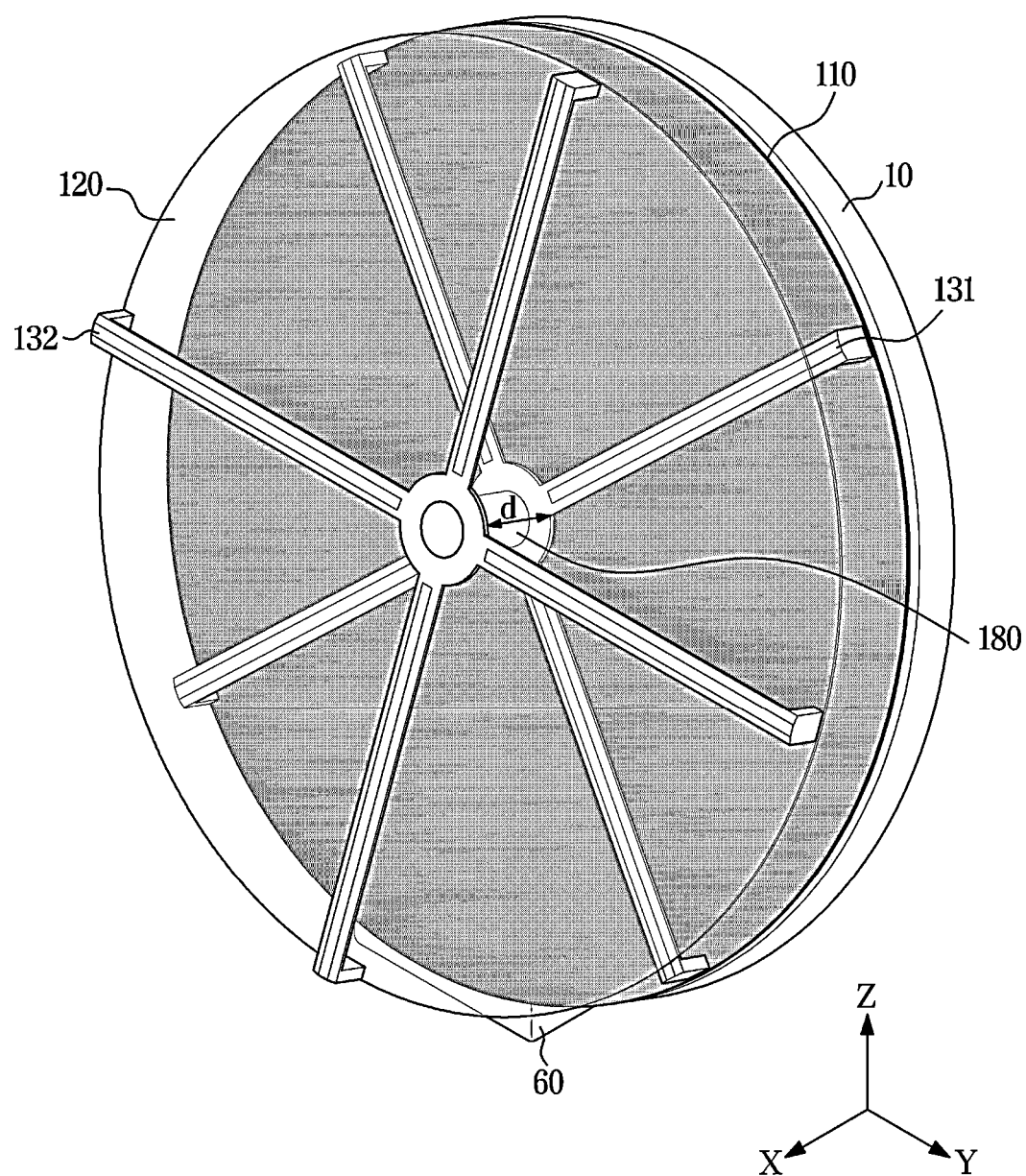
FIG. 9 is a perspective view illustrating a display apparatus according to another embodiment of the disclosure.
Figure 10:
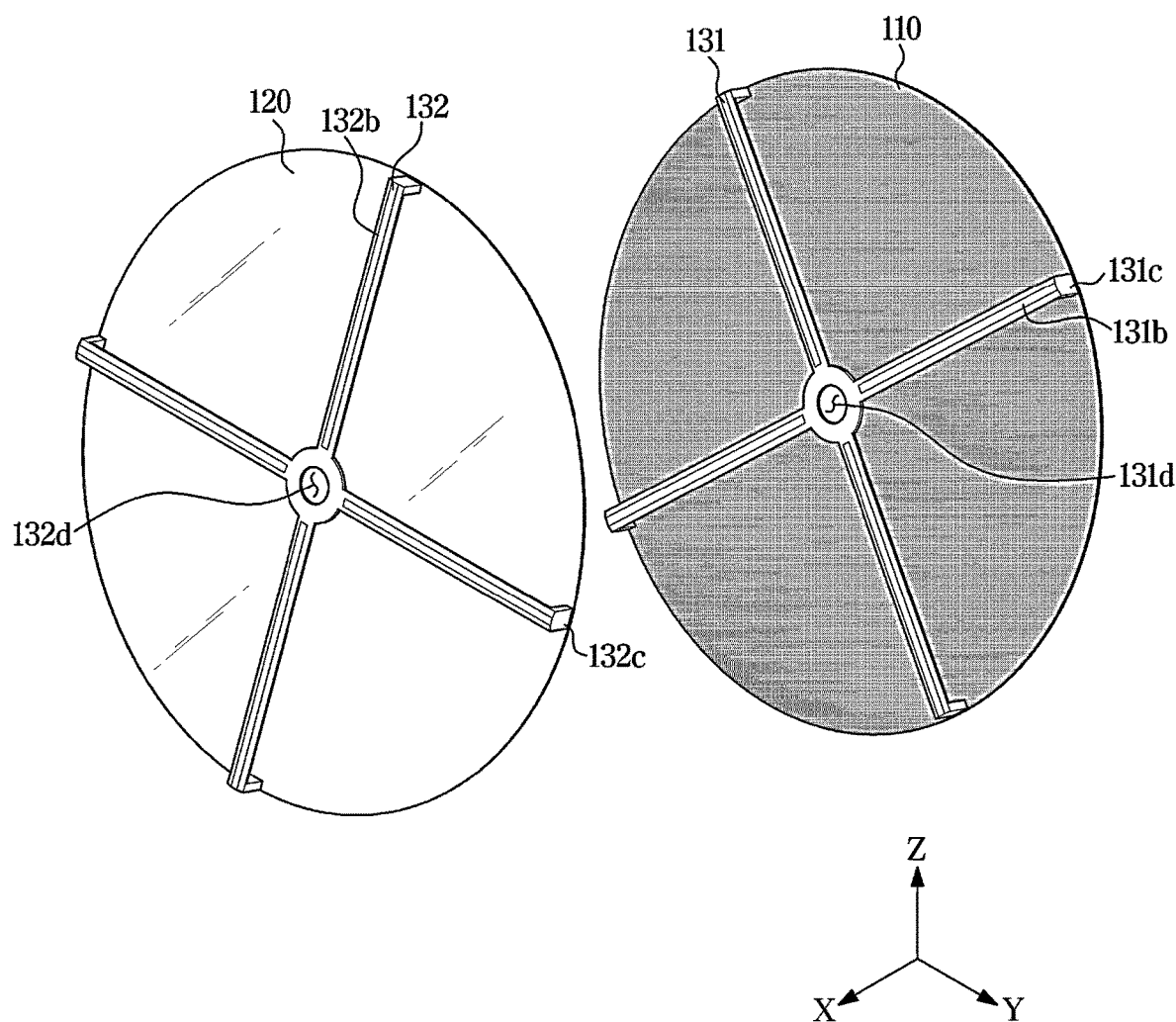
FIG. 10 is an exploded perspective view illustrating the display apparatus shown in FIG. 9.

FIG. 9 is a perspective view illustrating a display apparatus according to another embodiment of the disclosure. FIG. 10 is an exploded perspective view illustrating the display apparatus shown in FIG. 9. The same reference numerals are assigned to the same configurations as those in the above-described embodiments, and detailed description thereof may be omitted. For example, although the polarizing cover 160 is omitted in FIG. 10, the polarizing cover 160 may be employed as in the embodiment shown in FIGS. 6 and 7.

Referring to FIGS. 9 and 10, a display apparatus 4 according to another embodiment of the disclosure may include a plurality of rotating plates and a plurality of a substrate 130. The plurality of rotating plates may include a first rotating plate 110 and a second rotating plate 120. The plurality of the substrate 130 may include a first substrate 131 and a second substrate 132. The plurality of rotating plates and the plurality of the substrate 130 may be disposed at one side of a base 11.

The first substrate 131 may be coupled to the first rotating plate 110. The first substrate 131 may be coupled to the first rotating plate 110 to be rotated together with the first rotating plate 110. The first substrate 131 may include a first coupling rib 131c that extends from one end thereof in the radial direction of the first rotating plate 110 toward the first rotating plate 110. The first coupling rib 131c may be coupled to the first rotating plate 110 at the circumference of the first rotating plate 110. The second substrate 132 may be coupled to the second rotating plate 120. The second substrate 132 may be rotated together with the second rotating plate 120. The second substrate 132 may include a second coupling rib 132c that extends from one end thereof in the radial direction of the second rotating plate 120 toward the second rotating plate 120. The second coupling rib 132c may be coupled to the second rotating plate 120 at the circumference of the second rotating plate 120. The first substrate 131 and the second substrate 132 may be connected to each other through a connecting frame 180 (refer to FIG. 80. The connecting frame 180 may pass through a connection hole 131d of the first substrate 131 and a connection hole 132d of the second substrate 132. The length of the connecting frame 180 between the first substrate 131 and the second substrate 132 may be variable.

Figure 11:
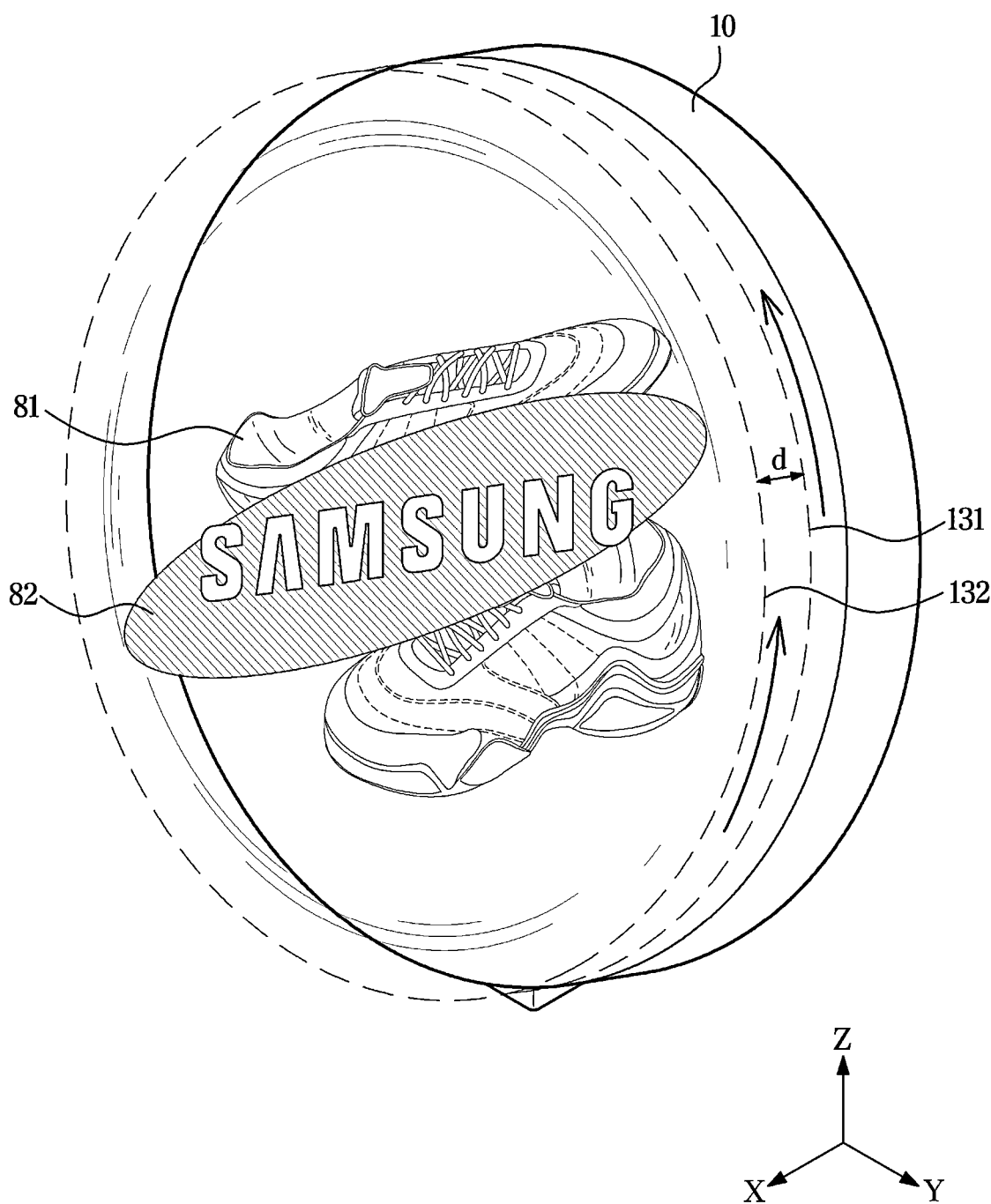
FIG. 11 is a view illustrating a state in which an image and/or a moving image is implemented in the display apparatus shown in FIG. 8 and/or FIG. 9.

FIG. 11 is a view illustrating a state in which an image is implemented in the display apparatus shown in FIG. 8 and/or FIG. 9.

Referring to FIG. 11, the display apparatus 3 or the display apparatus 4 may allow the rotating plate 100 and the substrate 130, on which the inorganic light emitting devices 140 are mounted, to be rotated so that an afterimage resulting from rotation implements displays as images (e.g. a still image and/or a moving image). For example, the displays may be displayed on the rotation trajectory of the inorganic light emitting devices 140 mounted on the substrate 130. The images (e.g. a first image 81 and a second image 82) according to the embodiment of the disclosure may form a 3D image.

Specifically, the first image 81 may be implemented by rotating the first rotating plate 110 and the first substrate 131, and the second image 82 may be implemented by rotating the second rotating plate 120 and the second substrate 132. Because the first substrate 131 and the second substrate 132 are spaced apart from each other by the predetermined distance d, the first image 81 and the second image 82 may be spaced apart from each other. The predetermined distanced between the first image 81 and the second image 82 may vary according to the length of the connecting frame 180. By adjusting the predetermined distance d between the first image 81 and the second image 82, a more volumetric 3D image may be implemented.

According to the embodiment of the disclosure, because the displays are implemented by rotation of the first rotating plate 110, the second rotating plate 120, and the substrate 130 of the display apparatus, the displays may be provided in various shapes, such as a circle, other than the conventional quadrangular shape. In addition, because the displays are implemented by rotation, the inorganic light emitting devices 140 do not need to be mounted over the entire display area, so that the number of the inorganic light emitting devices 140 may be reduced. Accordingly, the material cost and production cost of the display apparatus 3 or the display apparatus 4 may be reduced.

Figure 12:
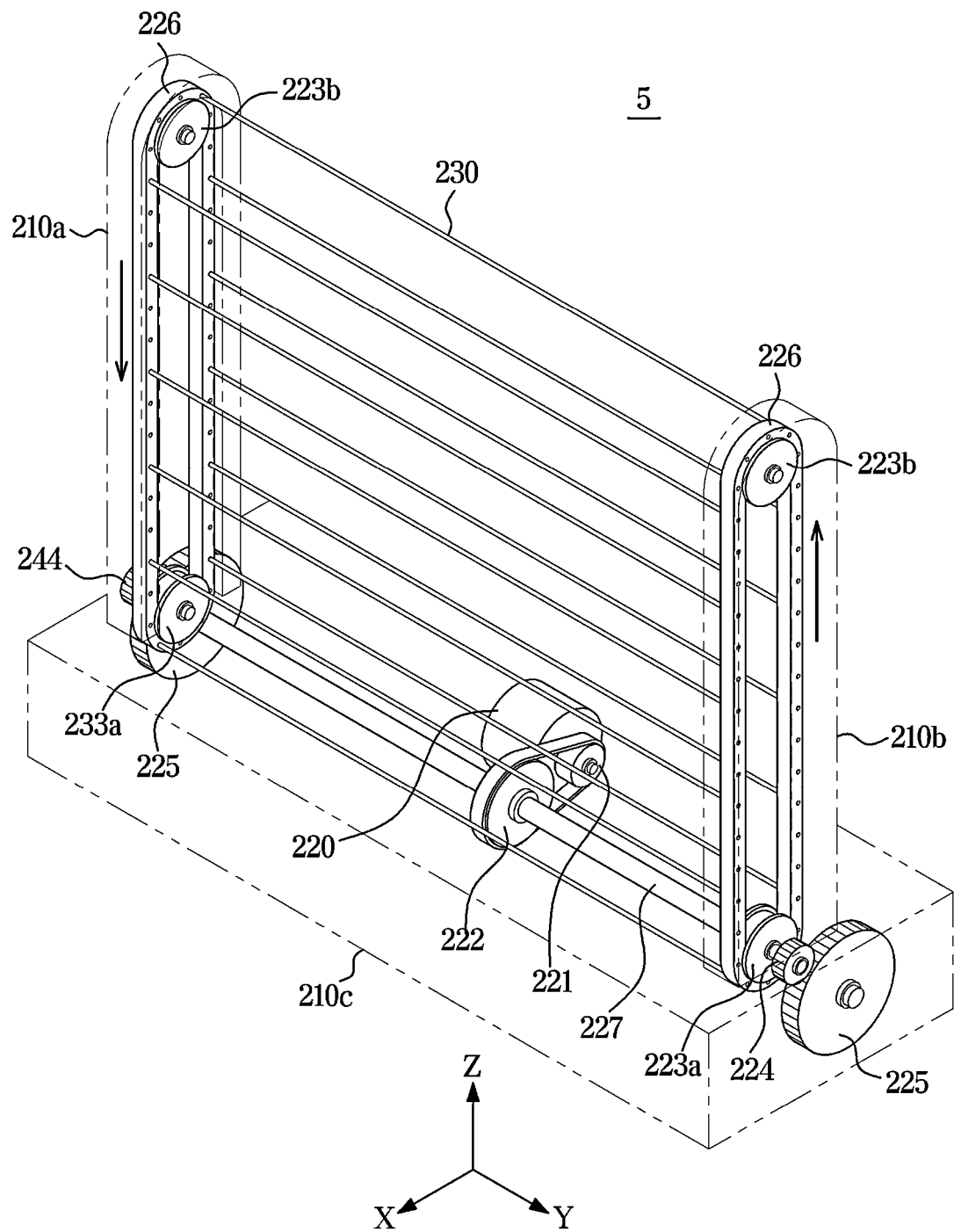
FIG. 12 is a perspective view illustrating a display apparatus according to another embodiment of the disclosure.
Figure 13:
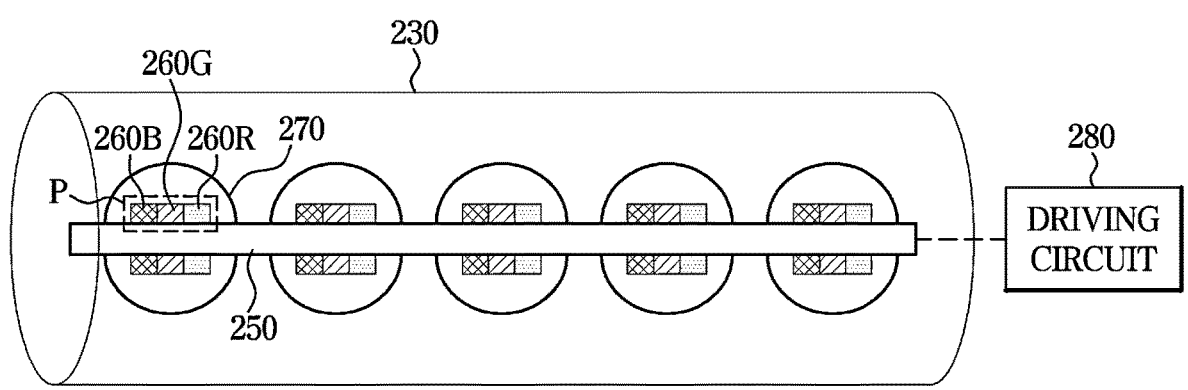
FIG. 13 is an enlarged schematic view illustrating a transparent wire of the display apparatus shown in FIG. 12.
Figure 14:
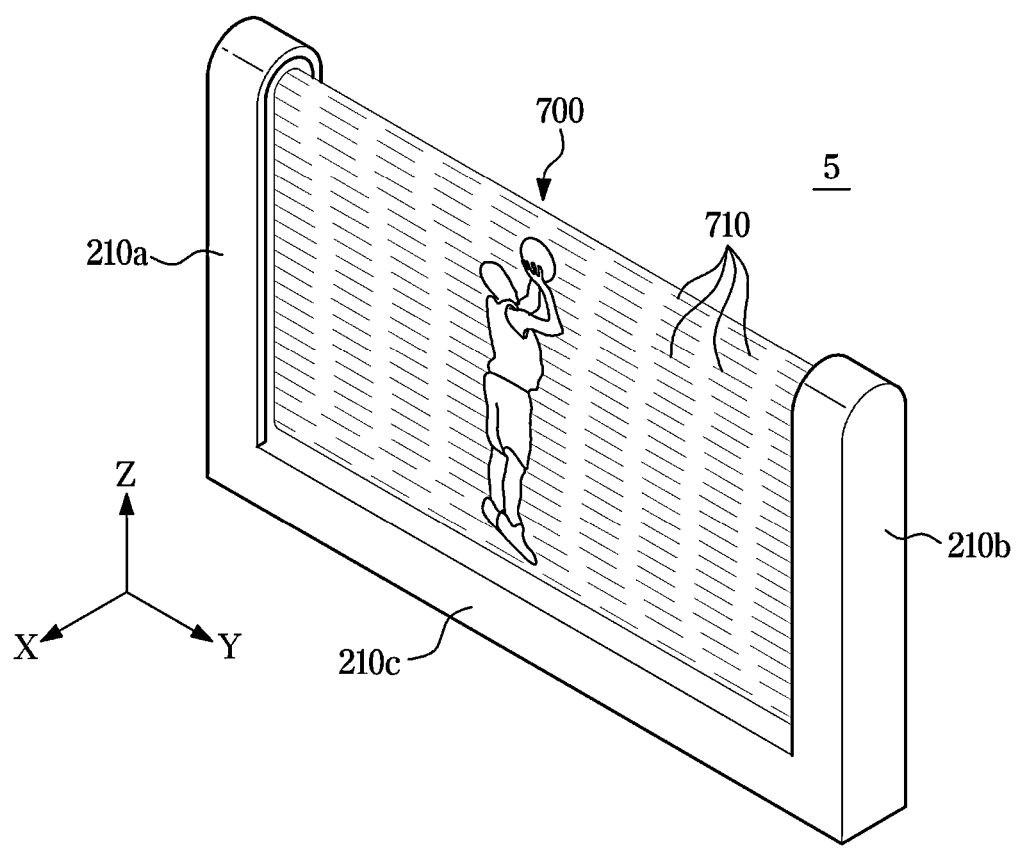
FIG. 14 is a view illustrating a state in which an image and/or a moving image is implemented in the display apparatus shown in FIG. 12.

FIG. 12 is a perspective view illustrating a display apparatus according to another embodiment of the disclosure. FIG. 13 is an enlarged schematic view illustrating a transparent wire of the display apparatus shown in FIG. 12. FIG. 14 is a view illustrating a state in which an image is implemented in the display apparatus shown in FIG. 12.

Referring to FIGS. 12 to 14, a display apparatus 5 according to another embodiment of the disclosure includes a main body 210, a motor 220, pulleys (e.g., a first pulley 221, a second pulley 222, a third pulley 223a, a fourth pulley 223b, a fifth pulley 224, and a sixth pulley 225), a belt 226, a shaft 227, and a transparent wire 230.

The main body 210 may include a plurality of frames. For example, the main body 210 may include a first frame 210a, a second frame 210b, and a third frame 210c. The first frame 210a and the second frame 210b may extend vertically from the third frame 210c. The first frame 210a and the second frame 210b may extend upward from opposite ends of the third frame 210c. However, embodiments of the disclosure are not limited thereto, and the main body 210 may further include a fourth frame (e.g., fourth frame 210d in FIG. 16) coupled to upper ends of the first frame 210a and the second frame 210b. In addition to the above, the main body 210 may be provided in various shapes.

At an inner side of the plurality of frames (e.g., the first frame 210a, the second frame 210b, and the third frame 210c), the pulleys (e.g., the first pulley 221, the second pulley 222, the third pulley 223a, the fourth pulley 223b, the fifth pulley 224, and the sixth pulley 225) and the belt 226 for rotating the transparent wire 230 may be provided. However, the positions of the pulleys and the belt 226 are not limited to the inner side of the plurality of frames. Components rotated by the pulleys and the belt 226 may be a substrate 250 that is included in the transparent wire 130.

The motor 220 may transmit power to the pulleys and the belt 226 for the transparent wire 230 to be rotated. The motor 220 may be connected through the pulleys (e.g., the first pulley 221, the second pulley 222, the third pulley 223a, the fourth pulley 223b, the fifth pulley 224, and the sixth pulley 225) and the belt 226 to cause the transparent wire 230 to rotate along the upper and lower direction (e.g., Z and −Z directions). A plurality of the pulleys may be provided. The plurality of pulleys may include a first pulley 221 directly connected to the motor 220, a second pulley 222 connected to the first pulley 221 through a belt, a third pulley 223a disposed in the main body 210 and connected to the second pulley 222 through a shaft 227, a fourth pulley 223b disposed in the main body 210 and connected to the third pulley 223a through a belt 226, a fifth pulley 224, and a sixth pulley 225. The third pulley 223a and the fourth pulley 223b may be disposed at an inner side of the first frame 210a and/or the second frame 210b. The fourth pulley 223b may be disposed above the third pulley 223a. Power generated from the motor 220 may be transmitted to the pulleys and the belt 226, and the transparent wire 230 may be rotated along the upper and lower directions.

Inside the transparent wire 230, a plurality of light emitting devices 260 may be disposed. As the plurality of light emitting devices 260 emit light along with rotation of the transparent wire 230, a display (e.g., a still image and/or a moving image) may be represented. The transparent wire 230 may be formed of a flexible material.

Referring to FIG. 13, the plurality of light emitting devices 260 may be provided inside the transparent wire 230. The plurality of light emitting devices 260 (e.g., a red light emitting diode 260R, a green light emitting diode 260G, and a blue light emitting diode 260B) may be mounted on the substrate 250 provided in the longitudinal direction of the transparent wire 230. The plurality of light emitting devices 260 may be mounted on at least one of an upper surface or a lower surface of the substrate 250. The plurality of light emitting devices 260 may be provided as flip-chip LEDs.

Each of the plurality of light emitting devices 260 may be implemented with, for example, an inorganic material. Inorganic light emitting diodes have a fast response time compared to organic light emitting diodes (OLEDs) and realize high brightness with low power consumption. Organic light emitting diodes require an encapsulation process due to vulnerability to exposure to moisture and oxygen and have low durability, while inorganic light emitting diodes do not require an encapsulation process and have strong durability. In addition, each of the plurality of light emitting devices 260 may be, for example, a micro LED having a short side length within 100 μm. By using the micro-unit LED, the pixel size may be reduced and high resolution may be implemented.

The display apparatus 5 according to the embodiment may be an emissive display apparatus in which a light emitting diode is disposed for each pixel P so that each pixel P may emit light by itself. Because the display apparatus 5 does not require components, such as a backlight unit, a liquid crystal layer, and a polarizing plate, unlike a liquid crystal display apparatus, a thin thickness and a simple structure are provided, so that various changes of design are allowed.

A single pixel P may include a blue light emitting diode 260B configured to emit blue light, a green light emitting diode 260G configured to emit green light, and a red light emitting diode 260R configured to emit red light. Each of the blue light emitting diode 260B, the green light emitting diode 260G, and the red light emitting diode 260R may correspond to a sub-pixel. In addition, the pixel P may include sub-pixels emitting yellow light and/or white light. The number of pixels may be determined according to the length and cross-sectional area of the transparent wire 230. The plurality of light emitting devices 260 may form a line along the longitudinal direction of the transparent wire 230, and the line may be provided as one or more lines.

The plurality of light emitting devices 260 may emit light while the transparent wire 230 is rotated. While the transparent wire 230 is being rotated, the color and/or intensity of light emitted by each of the plurality of pixels may change. That is, the plurality of pixels may emit different light at each position of the transparent wire 230.

Light emitted by the plurality of light emitting devices 260 may leave a visual afterimage to the user. Light emitted from different positions according to rotation of the transparent wire 230 may generate an image. A user may view an image that is combination of afterimages of lights consecutively emitted from different positions.

However, the components rotated by the pulleys (e.g., the first pulley 221, the second pulley 222, the third pulley 223a, the fourth pulley 223b, the fifth pulley 224, and the sixth pulley 225) and the belt 226 may be the substrate 250, and the transparent wire 230 may be omitted. For example, referring to FIGS. 12 and 13, the substrate 250 may be rotated along the upper and lower directions (e.g., Z and −Z directions). In this case, the plurality of light emitting devices 260 may be mounted on at least one of two surfaces of the substrate 250. For example, the plurality of light emitting devices 260 may be mounted on both sides of the substrate 250 opposite to each other in the X-direction or the −X-direction. Alternatively, the plurality of light emitting devices 260 may be mounted only on one of two sides of the substrate 250 that are opposite to each other in the X direction or the −X direction.

The substrate 250 may be an LED passive matrix (PM) driving substrate or an LED active matrix (AM) driving substrate. The substrate 250 may include devices for driving the plurality of light emitting devices 260, such as a switching transistor, a driving transistor, and a capacitor. The substrate 250 may be formed of various materials. For example, the substrate 250 may be formed of transparent glass containing $SiO_2$ as a main component, may be formed of transparent plastic having flexibility, or may be formed of metal.

The substrate 250 may include inorganic material selected from the group consisting of polyethersulfone (PES), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (TAC), and cellulose acetate propionate (CAP).

The metal included in the substrate 250 may be selected from the group consisting of iron, chromium, manganese, nickel, titanium, molybdenum, stainless steel (SUS), Invar alloy, Inconel alloy, and Kovar alloy.

In addition, a lens 270 covering the pixel P may be mounted on the substrate 250. The plurality of pixels may be covered by a plurality of the lens 270. The lens 270 may diffuse light emitted from the light emitting devices 260. The lens 270 may be provided in various shapes. For example, the lens 270 may be provided in a semicircular shape. The lens 270 is formed of a transparent material.

A driving circuit 280 may drive the plurality of light emitting devices 260. In other words, the driving circuit 280 may control on or off operations of the plurality of light emitting devices 260. The substrate 250 may be electrically connected to the driving circuit 280, and may transmit a signal, voltage, and/or current transmitted from the driving circuit 280 to the plurality of light emitting devices 260. The driving circuit 280 may be provided as a separate chip, and may be mounted on the substrate 250.

Referring to FIG. 14, the display apparatus 5 may obtain an image frame 700 by decoding image data. In addition, the display apparatus 5 may divide the image frame 700 into a plurality of image frame parts 710. For example, the display apparatus 5 may obtain image frame parts 710 by dividing the image frame 700 in the vertical direction.

According to an embodiment of the disclosure, because the display is implemented by rotating the transparent wire 230 and the substrate 250 of the display apparatus, the inorganic light emitting devices 260 do not need to be mounted on the entire display area, so that the number of light emitting devices 260 may be reduced. Accordingly, the material cost and production cost of the display apparatus 5 may be reduced.

Figure 15:
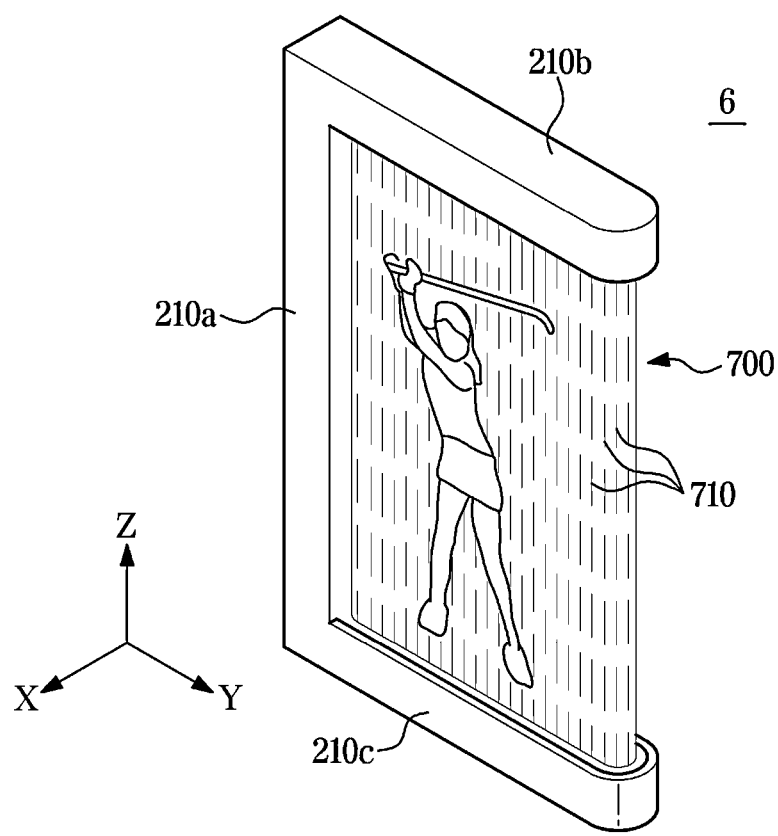
FIG. 15 is a perspective view illustrating a display apparatus according to still another embodiment of the disclosure.
Figure 16:
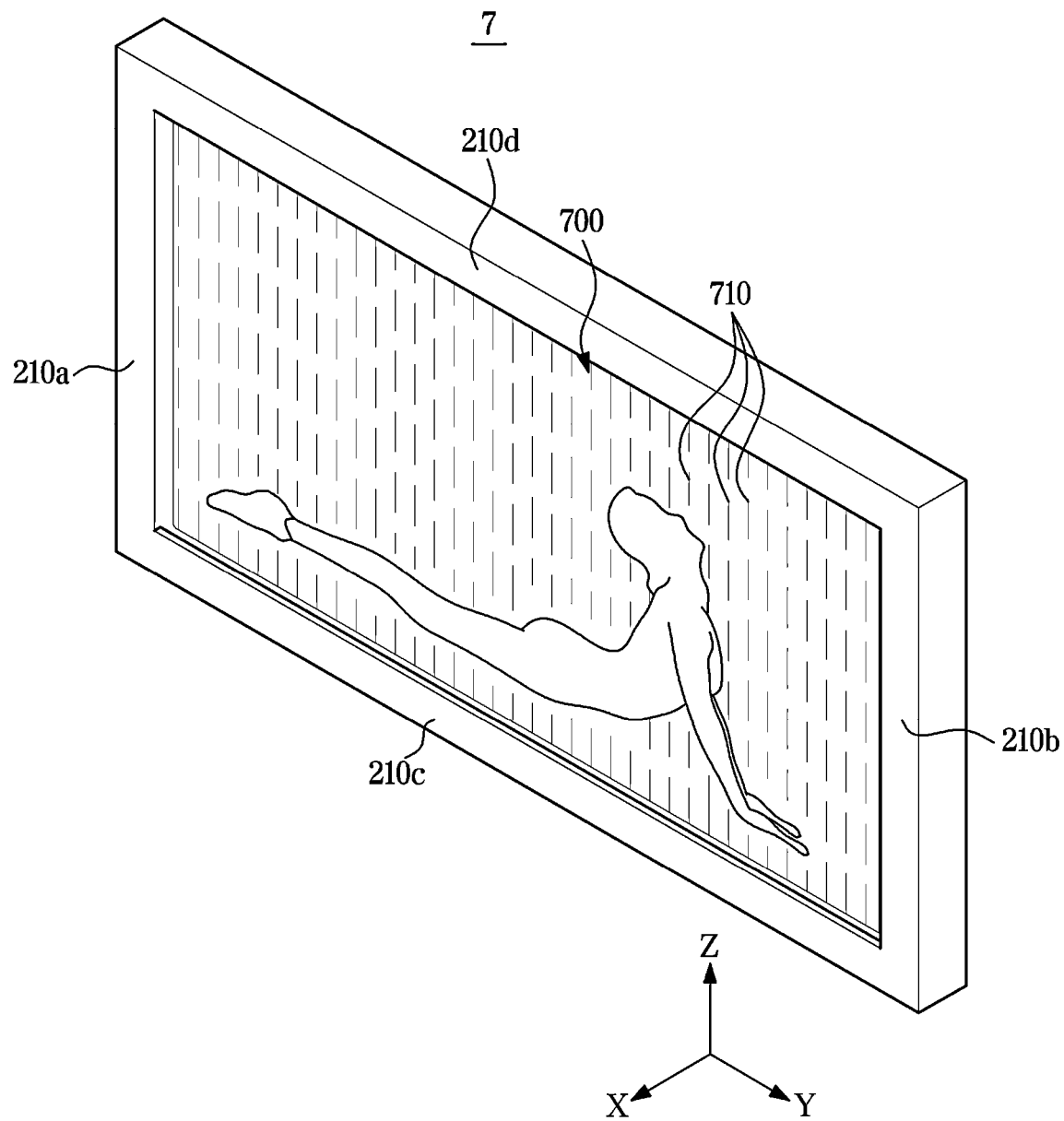
FIG. 16 is a perspective view illustrating a display apparatus according to another embodiment of the disclosure.

FIG. 15 is a perspective view illustrating a display apparatus according to another embodiment of the disclosure, and FIG. 16 is a perspective view illustrating a display apparatus according to another embodiment of the disclosure.

The same reference numerals are assigned to the same configurations as those in the above-described embodiment, and detailed description thereof may be omitted.

Referring to FIG. 15, a display apparatus 6 according to another embodiment of the disclosure may include a first frame 210*a*, a second frame 210*b*, and a third frame 210*c*. The first frame 210*a* may extend in an upper and lower direction (e.g., in Z and −Z directions). The second frame 210*b* may extend from an upper end of the first frame 210*a* along the Y direction. The third frame 210*c* may extend from a lower end of the first frame 210*a* in the Y direction.

Referring to FIG. 16, a display apparatus 7 according to another embodiment of the disclosure may include a first frame 210*a*, a second frame 210*b*, a third frame 210*c*, and a fourth frame 210*d*. The first frame 210*a* and the second frame 210*b* may extend in the upper and lower direction. The first frame 210*a* and the second frame 210*b* may be disposed to be spaced apart from each other. The third frame 210*c* may extend in the left and right direction to connecting lower ends of the first frame 210*a* and the second frame 210*b* to each other. The fourth frame 210*d* may extend in the left and right direction to connect upper ends of the first frame 210*a* and the second frame 210*b* to each other.

The display apparatus 6 or the display apparatus 7 may obtain an image frame 700 by decoding image data. In addition, the display apparatus 6 or the display apparatus 7 may divide the image frame 700 into a plurality of image frame parts 710.

Figure 17:
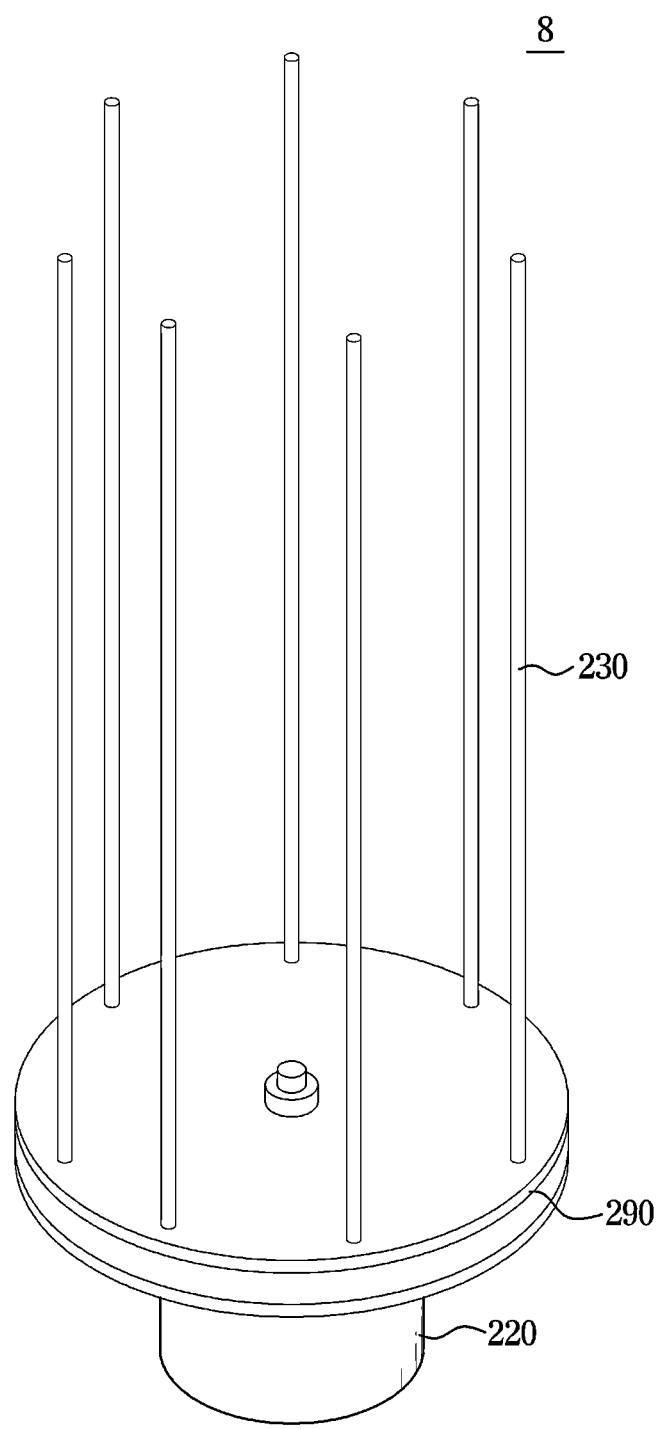
FIG. 17 is a perspective view illustrating a display apparatus according to another embodiment of the disclosure.
Figure 18:
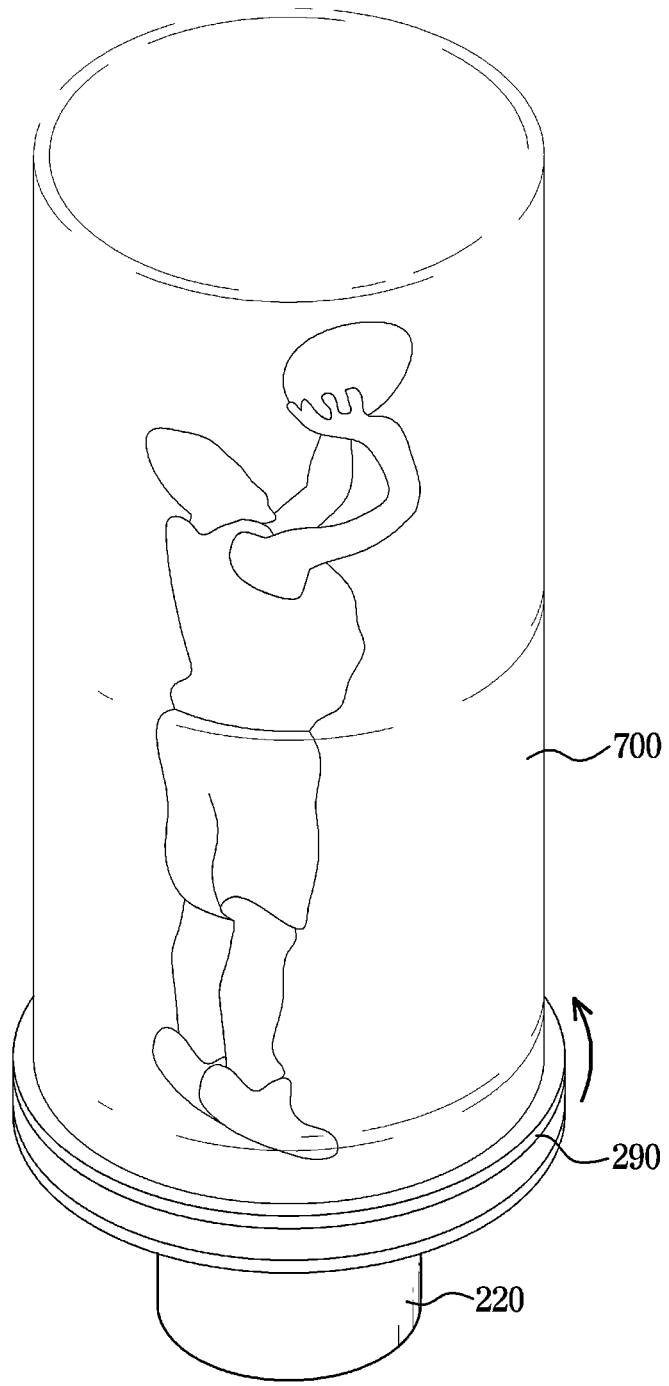
FIG. 18 is a diagram illustrating a state in which an image and/or a moving image is implemented in the display apparatus shown in FIG. 17.

FIG. 17 is a perspective view illustrating a display apparatus according to another embodiment of the disclosure. FIG. 18 is a diagram illustrating a state in which a still image and/or a moving image is implemented in the display apparatus shown in FIG. 17.

The same reference numerals are assigned to the same configurations as those in the above-described embodiment, and detailed description thereof may be omitted.

Referring to FIGS. 17 and 18, a display apparatus 8 according to another embodiment of the disclosure may include a motor 220, a rotating plate 290, and a transparent wire 230.

The motor 220 may rotate the rotating plate 290. The rotating plate 290 may be coupled to an upper side of the motor 220. The rotating plate 290 may be coupled to the transparent wire 230. The transparent wire 230 may be coupled to the rotating plate 290 and extend in the upper and lower direction. A plurality of light emitting devices may be disposed inside the transparent wire 230. As the plurality of light emitting devices emit light while the transparent wire 230 is rotating, a still image and/or a moving image may be displayed.

The display apparatus 8 may obtain an image frame 700 by decoding image data. According to the embodiment of the disclosure, because the display is implemented by rotating the transparent wire 230 and the rotating plate 290 of the display apparatus, the inorganic light emitting devices do not need to be mounted on the entire display area, so that the number of the inorganic light emitting devices may be reduced. Accordingly, the material cost and production cost of the display apparatus 8 may be reduced.

Figure 19:
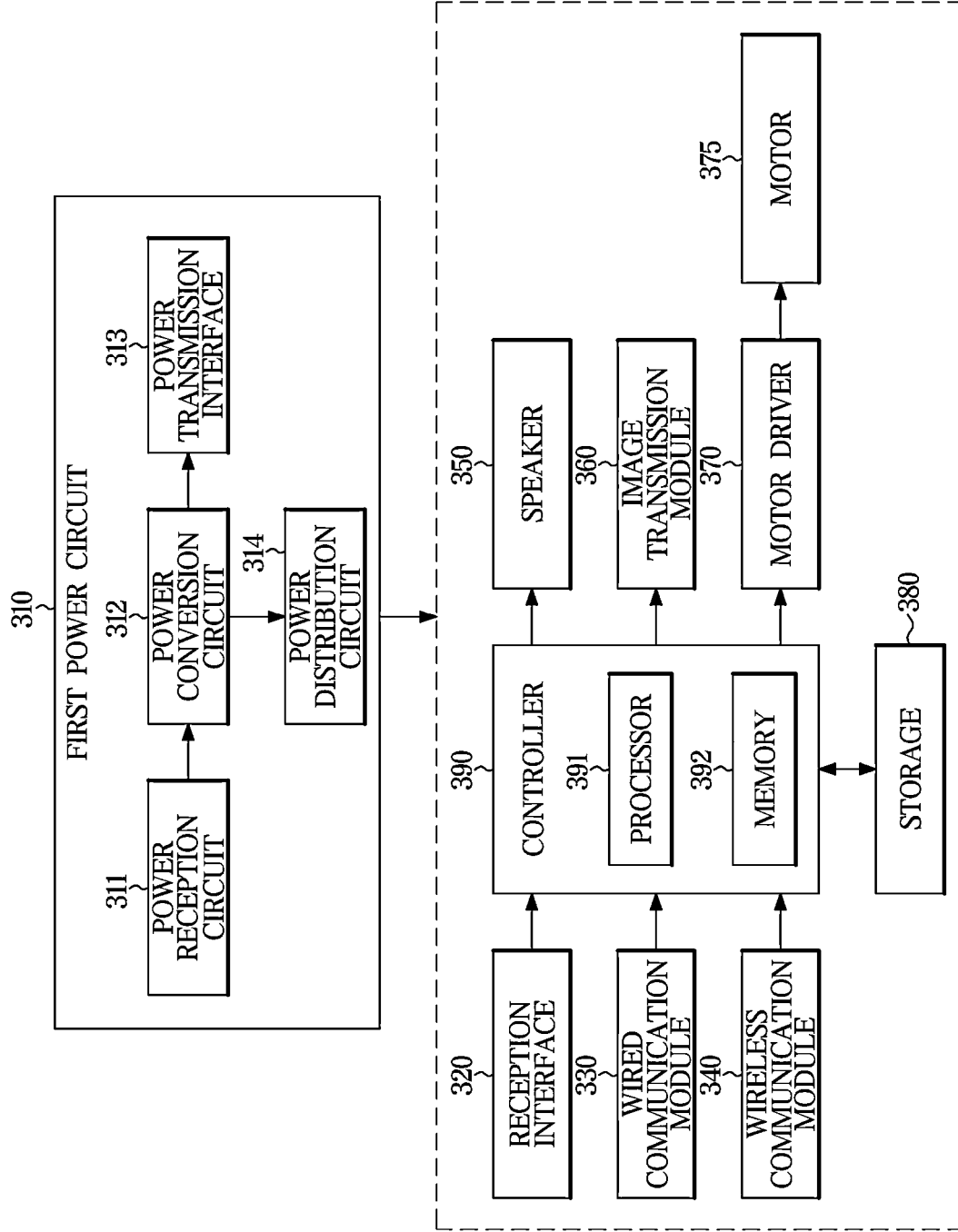
FIG. 19 is a control block diagram illustrating components provided in a base of a display apparatus according to an embodiment of the disclosure.
Figure 20:
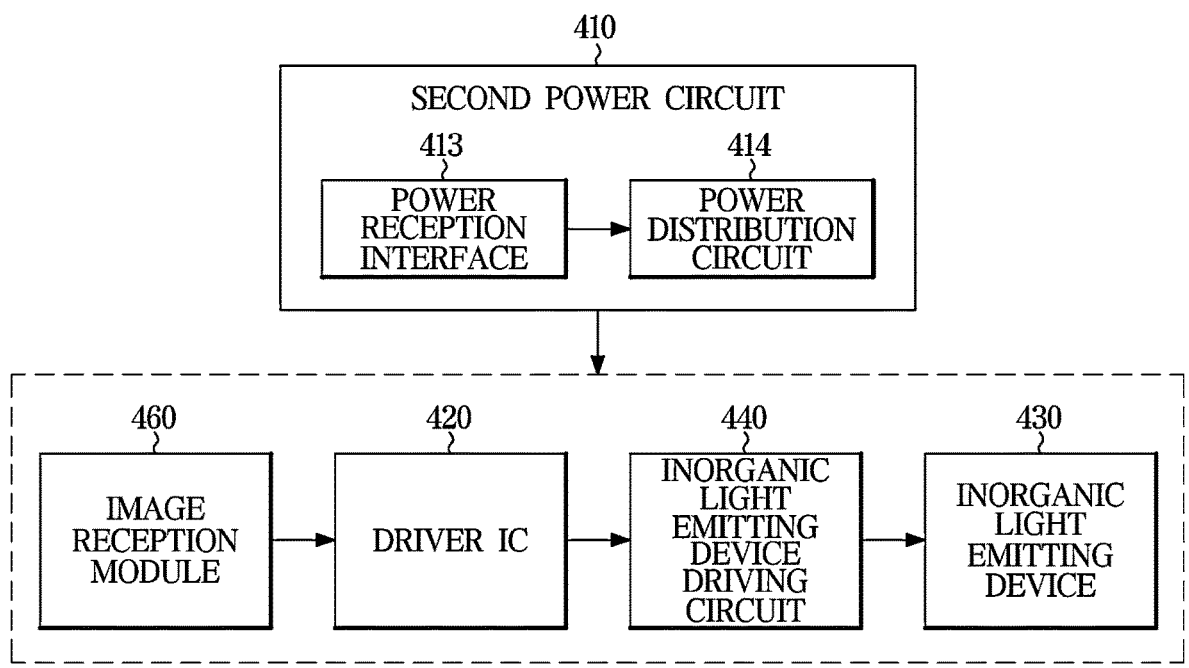
FIG. 20 is a control block diagram illustrating components provided in a rotating plate of a display apparatus according to an embodiment of the disclosure.

FIG. 19 is a control block diagram illustrating components provided in a base of a display apparatus according to an embodiment of the disclosure. FIG. 20 is a control block diagram illustrating components provided in a rotating plate of a display apparatus according to an embodiment of the disclosure. As described above, the rotating plate and the components provided on the rotating plate may form a display panel.

The same reference numerals are assigned to the same configurations as those in the above-described embodiment, and detailed description thereof may be omitted.

A display panel may include a rotating plate 100 and components provided in the rotating plate 100. For example, the display panel may include a rotating plate 100, a substrate 130, inorganic light emitting devices 140, and a drive integrated chip (IC) 420.

Referring to FIG. 19, a first power circuit 310, a reception interface 320, a wired communication module 330, a wireless communication module 340, a speaker 350, an image transmission module 360, a motor driver 370, a motor 375, a storage 380, and a controller 390 may be included inside or outside a housing 10. For example, the communication device 200 shown in FIG. 2 may include the reception interface 320, the wired communication module 330, the wireless communication module 340, and the image transmission module 360.

The first power circuit 310 may receive power from a household power source or a commercial power source, may supply the power to electrical components provided in the base 11 of the display apparatus 1, and transmit power to the display panel.

The first power circuit 310 may include a power reception circuit 311, a power conversion circuit 312, a power distribution circuit 314, and a power transmission interface 313.

The power reception circuit 311 may receive alternating current (AC) power from an external AC power source. The power reception circuit 311 may include, for example, electromagnetic interference (EMI) filters, a power factor correction circuit, or the like. The power reception circuit 311 may provide AC power to the power conversion circuit 312.

The power conversion circuit 312 may convert AC power into DC power and also convert a voltage of the converted DC power. The power conversion circuit 312 may include, for example, a rectifier circuit, a DC-DC converter, or the like.

The power conversion circuit 312 may transmit the converted DC power to the power distribution circuit 314, and the power distribution circuit 314 may distribute the DC power to components provided in the base 11.

In addition, the power conversion circuit 312 may transmit DC power to the power transmission interface 313 to supply the display panel with power. The power transmission interface 313 may be in contact with a power reception interface (e.g., power reception interface 413 in FIG. 20) to transmit the transmitted DC power to the display panel. Details thereof will be described below.

The reception interface 320, the wired communication module 330, and the wireless communication module 340 are components for receiving content data from a content source, and may be collectively referred to as a content receiving device.

The reception interface 320 may receive a video signal and an audio signal from content sources through a cable. The reception interface 320 may include, for example, a component (YPbPr/RGB) terminal, a composite video blanking and sync (CVBS) terminal, an audio terminal, a high definition multimedia interface (HDMI) terminal, a universal serial bus (USB) terminal, and the like. The reception interface 320 may output the received video signal and/or audio signal to the controller 390.

The wired communication module 330 may connect to a wired network and communicate with external devices, such as a content source, through the wired network. For example, the wired communication module 330 may connect to a local network and/or wide area network through Ethernet (Ethernet, IEEE 802.3 technology standard), and receive data from external devices through the local network and/or wide area network.

The wired communication module 330 may receive content data including video data and/or audio data from a content source, and may provide the received content data to the controller 390.

The wireless communication module 340 may wirelessly communicate with a base station or access point (AP), and may access a local network and/or wide area network through the base station or AP. The wireless communication module 340 may also communicate with external devices, such as a content source, via the base station or AP. For example, the wireless communication module 340 may wirelessly communicate with an AP using Wi-Fi (WiFi, IEEE 802.11 technology standard), or may communicate with the base station using code division multiple access (CDMA), wideband code division multiple access (WCDMA), global system for mobile communications (GSM), long term evolution (LTE), wireless broadband (WiBro), etc. According to embodiments, the wireless communication module 340 may include a transmitter and/or a receiver.

The wireless communication module 340 may directly communicate with external devices as well as communicating with external devices via the base station or AP. For example, the wireless communication module 340 may wirelessly receive data from external devices using Wi-Fi Direct (Wi-Fi Peer-to-peer), Bluetooth (Bluetooth, IEEE 802.15.1 technology standard), ZigBee (ZigBee, IEEE 802.15.4 technology standard), etc.

The wireless communication module 340 may receive content data including video data and/or audio data from a content source, and may provide the received content data to the controller 390.

The storage 380 may store content data including video and/or audio. The storage 380 may also store content data including video and/or audio.

The storage 380 may be provided as a non-volatile memory capable of retaining data even when power supply is cut off. For example, the storage 380 may include a flash memory, a semiconductor device driver (a solid state drive (SSD)), a hard disk drive (HDD), and an optical disc driver (ODD).

The controller 390 may receive content data from the reception interface 320 or the wired communication module 330 or the wireless communication module 340 or the storage 380, and process the received content data. The controller 390 may include at least one memory 392 in which a program for processing the content data and data required to process the content data are stored, and at least one processor 391 for executing the stored program.

The controller 390 may extract video data and audio data from the received content data. The controller 390 may decode the audio data, and as a result from decoding the audio data, may obtain an audio signal from the audio data. The processor 190 may provide the audio signal to the speaker 350.

Further, the controller 390 may decode the video data, and as a result of decoding the video data, obtain a series of image data each representing an image frame 700. The video data may include a consecutive series of image frames, and the consecutive series of image frames may be compressed. The controller 390 may decode the video data in which the series of image frames are compressed, to obtain image data representing a series of image frames.

In addition, the controller 390 may perform a timing control function. That is, the controller 390 may convert image data representing image frames into data in a form to be processed by the driver IC (e.g., driver IC 420 in FIG. 20), and generate various control signals, such as a timing control signal and the like, that are used to display image data on the display panel.

As described above, the display panel may display an image using the afterimage effect generated by rotation of the rotating plate 100 on which the inorganic light emitting devices 140 are disposed. Accordingly, the controller 390 may generate the control signal based on information about the number and spacing of bars arranged on the rotating plate 100, a frame rate, and the like.

In addition, the controller 390 may rotate the display panel in connection with an image displayed by the display panel.

To this end, the motor driver 370 may receive a target speed command from the controller 390, and transmit a driving current corresponding to the received target speed command to the motor 375 (e.g., the motor 20 shown in FIG. 2 and/or the motor 220 shown in FIG. 12).

The motor driver 370 may control the driving current provided to the motor 375 based on a difference between a target speed of the target speed command and a measured speed of the motor 375. For example, the motor driver 370 may receive information about rotation of the motor 375 from a rotation sensor provided in the motor 375. In addition, the motor driver 370 may obtain a driving current value supplied to the motor 375 and identify the rotation speed of the motor 375 based on the driving current value.

For example, the motor driver 370 may increase the driving current in response to the measured speed of the motor 375 being less than the target speed. In addition, the motor driver 370 may decrease the driving current in response to the measured speed of the motor 375 being greater than the target speed.

The motor 375 may be supplied with a driving current from the motor driver 370, and may rotate the display panel in response to the driving current supplied from the motor driver 370.

For example, the motor 375 may include a permanent magnet that forms a magnetic field and a coil that forms a magnetic field in response to a driving current. The motor 375 may use a magnetic interaction between the magnetic field of the permanent magnet and the magnetic field of the coil to rotate a rotating shaft connected to the display panel. In other words, the magnetic interaction between the magnetic field of the permanent magnet and the magnetic field of the coil may provide the rotating shaft with a torque, and the rotating shaft may be rotated depending on the torque.

The controller 390 may determine the rotation rate of the display panel based on the frame rate of the image frames. For example, when the frame rate is 120 Hz, the rotation rate of the display panel may be determined as 1000 RPM, and when the frame rate is 60 Hz, the rotation rate of the display panel may be determined as 500 RPM. That is, the frame rate may be adjusted by changing the rotation rate of the display panel or the rotation rate of the motor 395.

The speaker 350 may receive an audio signal that is an electrical signal from the controller 390, and may output a sound corresponding to the audio signal that is an electrical signal.

The image transmission module 360 may receive image data representing image frames and various control signals from the controller 390, and wirelessly transmit the received image data and control signals to the display panel. Accordingly, the base 11 and the controller 390 do not need to be connected with a cable when transmitting image data, a cable is prevented from being twisted during rotation of the rotating plate 100. According to embodiments, the image transmission module 360 may include a transmitter and/or a receiver.

The image transmission module 360 may transmit image data and control signals using one of various wireless communication methods. For example, the image transmission module 360 may transmit image data and control signals to the display panel through a short-range wireless network using a 60 GHz band.

Referring to FIG. 20, the display panel may include a second power circuit 410, an image reception module 460, a driver IC 420, a light emitting device driving circuit 440, and a plurality of inorganic light emitting devices 430.

The second power circuit 410 may include a power reception interface 413 and a power distribution circuit 414.

The power reception interface 413 may receive power while in contact with the power transmission interface 313 provided on the base 11. For example, the power transmission interface 313 may include a female connector having a depression, and the power reception interface 413 may include a male connector having a protrusion. The male connector of the power reception interface 413 may be inserted into the female connector of the power transmission interface 313, and power may be transferred from the power transmission interface 313 to the power reception interface 413.

As another example, the power reception interface 413 may include a spring rod pin, and the power transmission interface 313 may include a planar electrode. The spring rod pin of the power reception interface 413 may be in contact with the planar electrode of the power transmission interface 313, and power may be transferred from the power transmission interface 313 to the power reception interface 413.

The power distribution circuit 414 may distribute the power received by the power reception interface 413 to components included in the display panel.

The image reception module 460 may wirelessly receive image data and control signals from the image transmission module 360, and the received image data and control signals may be transmitted to the driver IC 420. According to embodiments, the image reception module 460 may include a transmitter and/or a receiver.

The driver IC 420 may generate a driving signal such that the plurality of light emitting devices 430 display images based on the transferred image data and the control signals.

The generated driving signal is input to the light emitting device driving circuit 440. The light emitting device driving circuit 440 may include various circuit devices for supplying driving currents to the plurality of light emitting devices 430. The light emitting device driving circuit 440 may include a passive matrix (PM) driving circuit or an active matrix (AM) driving circuit depending on a method of driving the plurality of light emitting devices 430.

As described above, the rotating plate 100 may be provided in plural so that a volumetric 3D image may be implemented. That is, the display apparatus 1 according to the embodiment may include a plurality of display panels, and each of the display panels may include the components shown in FIG. 20.

For example, a moving second object may be displayed on a second display panel disposed on the front side, and a first object indicating a background may be displayed on a first display panel disposed on the rear side. The controller 390 may generate first image data representing the first object to be displayed on the first display panel and a first control signal, and generate second image data representing the second object to be displayed on the second display panel and a second control signal.

The image transmission module 360 may transmit the first image data and the first control signal to the image reception module 460 of the first display panel, and transmit the second image data and the second control signal to the image reception module 460 of the second display panel.

Alternatively, the first display panel may also be provided with an image transmission module, and in response to the second image data and the second control signal transmitted from the controller 390 to the first display panel, the first display panel may transmit the second image data and the second control signal to the second display panel.

In addition, the display apparatus 1 may implement a different three-dimensional effect by adjusting the interval between the first display panel and the second display panel according to the content data to be displayed. To this end, the controller 390 may determine the interval between the first display panel and the second display panel based on the content data, and may adjust the relative positions of the first display panel and the second display panel according to the determined interval. The base 11 may further include a motor 375 for adjusting the relative positions of the first display panel and the second display panel, and a structure for transmitting power generated from the motor 375.

In addition, the display apparatus 1 may display a 2D image. For example, a first display panel disposed on the front side may be turned on to display an image, and a second display panel disposed on the rear side may be turned off.

The above description may be applied not only to the display apparatus 1 but also to the display apparatus 2, the display apparatus 3, the display apparatus 4, the display apparatus 5, the display apparatus 6, the display apparatus 7, and the display apparatus 8.

As is apparent from the above, according to an aspect of the disclosure, a display apparatus capable of implementing various forms of displays can be provided.

According to an aspect of the disclosure, a display apparatus with reduced material cost by reducing the number of inorganic light emitting devices can be provided.

Although non-limiting example embodiments of the disclosure have been shown and described, such embodiments are for illustrative purposes only, and it will be appreciated by those skilled in the art that changes and modifications may be made in these embodiments without departing from the principles and scope of the present disclosure.

What is claimed is:

1. A display apparatus comprising:
   a housing comprising a base;
   a motor coupled to the housing;
   a plurality of rotating plates arranged at one side of the base in one direction and connected to the motor at a center of the base, the plurality of rotating plates being configured to be rotated by the motor and the plurality of rotating plates comprising a first rotating plate and a second rotating plate; and
   a plurality of substrates, each of the plurality of substrates comprising an inorganic light emitting device such that the plurality of substrates are configured to display an image at the one side of the base in the one direction, the plurality of substrates comprising:
a first substrate coupled to the first rotating plate and having a bar shape that extends in a first radial direction from a center of the first rotating plate, and
a second substrate coupled to the second rotating plate and having a bar shape that extends in a second radial direction from a center of the second rotating plate,
wherein the first rotating plate and the second rotating plate are spaced apart from each other in the one direction.

2. The display apparatus of claim 1, wherein the first substrate comprises a first surface facing the first rotating plate, and a second surface disposed at a side opposite to the first surface and on which the inorganic light emitting device of the first substrate is mounted, and
the second substrate comprises a first surface facing the second rotating plate, and a second surface disposed at a side opposite to the first surface and on which the inorganic light emitting device of the second substrate is mounted.

3. The display apparatus of claim 2, wherein a distance to the first rotating plate from the base in the one direction is smaller than a distance to the second rotating plate from the base in the one direction, and
the first rotating plate is provided in a color darker than a color of the second rotating plate to increase a contrast ratio of the image.

4. The display apparatus of claim 3, further comprising a polarizing cover configured to cover the plurality of rotating plates and the plurality of substrates at the one side of the base in the one direction.

5. The display apparatus of claim 4, further comprising a rotating body connected to the motor and a central portion of the first rotating plate, the rotating body being configured to transmit power generated from the motor to the plurality of rotating plates, the rotating body seated on the base at a central portion of the base.

6. The display apparatus of claim 5, further comprising a connecting frame that extends along the one direction to connect the central portion of the first rotating plate to a central portion of the second rotating plate.

7. The display apparatus of claim 5, wherein the rotating body comprises an opening formed in a central portion of the rotating body, and
the display apparatus further comprises a communication device that comprises:
a communication board disposed in the opening of the rotating body; and
a communication module mounted on the communication board and configured to receive image information.

8. The display apparatus of claim 7, further comprising:
a fixing member disposed in the opening of the rotating body and fixing the communication device inside the opening of the rotating body, and coupled to the base and the communication board; and
a cover plate arranged coplanar with the first rotating plate and covering an opening formed in the central portion of the first rotating plate to cover the fixing member and the communication device.

9. The display apparatus of claim 8, wherein the first substrate comprises a first coupling rib extending from one end of the first substrate toward the first rotating plate and coupled to the first rotating plate at an outer periphery of the first rotating plate, and
the second substrate comprises a second coupling rib extending from one end of the second substrate toward the second rotating plate and coupled to the second rotating plate at an outer periphery of the second rotating plate.

10. The display apparatus of claim 1, further comprising:
a content receiving device configured to receive content data from a content source; and
a controller configured to generate image data and a timing control signal corresponding to the received content data,
wherein the controller is further configured to generate the timing control signal based on a frame rate corresponding to the received content data and a number of the plurality of substrates.

11. The display apparatus of claim 10, further comprising:
an image transmission module provided on the base; and
an image reception module provided on each of the plurality of rotating plates,
wherein the image transmission module is configured to transmit and the image reception module is configured to receive the image data and the timing control signal in a wireless manner.

12. The display apparatus of claim 11, wherein the controller is further configured to determine a number of rotations of the motor based on the frame rate corresponding to the content data.

13. The display apparatus of claim 1, further comprising:
a power transmission interface provided on the base; and
a power reception interface provided on each of the plurality of rotating plates,
wherein the power transmission interface contacts with the power reception interface provided on at least one of the plurality of rotating plates and is configured to transmit power to the power reception interface provided on the at least one of the plurality of rotating plates.

14. The display apparatus of claim 11, wherein the image reception module provided on the first rotating plate is configured to receive first image data corresponding to a first object, and
the image reception module provided on the second rotating plate is configured to receive second image data corresponding to a second object.

15. The display apparatus of claim 14, wherein the first object represents a background, and the second object represents an object other than the background.

* * * * *